(12) United States Patent
Hirano et al.

(10) Patent No.: US 10,115,567 B2
(45) Date of Patent: Oct. 30, 2018

(54) PLASMA PROCESSING APPARATUS

(71) Applicant: Tokyo Electron Limited, Tokyo (JP)

(72) Inventors: Taichi Hirano, Miyagi (JP); Ken Yoshida, Miyagi (JP); Hikoichiro Sasaki, Miyagi (JP); Satoshi Yamada, Miyagi (JP); Yoshinobu Hayakawa, Miyagi (JP); Junji Ishibashi, Miyagi (JP); Fumitoshi Kumagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 648 days.

(21) Appl. No.: 14/853,140

(22) Filed: Sep. 14, 2015

(65) Prior Publication Data
US 2016/0079037 A1 Mar. 17, 2016

(30) Foreign Application Priority Data

Sep. 17, 2014 (JP) .................. 2014-188897
Jun. 26, 2015 (JP) .................. 2015-128277

(51) Int. Cl.
*H01J 37/32* (2006.01)

(52) U.S. Cl.
CPC .. *H01J 37/32146* (2013.01); *H01J 37/32091* (2013.01); *H01J 37/32165* (2013.01); *H01J 37/32183* (2013.01); *H01J 2237/04* (2013.01)

(58) Field of Classification Search
CPC .......... H01J 37/32146; H01J 37/32091; H01J 37/32165; H01J 37/32183; H01J 2237/04
(Continued)

(56) References Cited

U.S. PATENT DOCUMENTS 9,831,064 B2 * 11/2017 Konno .............. H01J 37/32146
2015/0000841 A1 * 1/2015 Yamada ............ H01J 37/32183
156/345.28

(Continued)

FOREIGN PATENT DOCUMENTS

JP 2012-009544 A 1/2012
JP 2013-033856 A 2/2013

*Primary Examiner* — Daniel D Chang
(74) *Attorney, Agent, or Firm* — Pearne & Gordon LLP

(57) ABSTRACT

A plasma processing apparatus can efficiently perform a pulse modulation method of switching a high frequency power to be used in a plasma process between a high level and a low level alternately according to a duty ratio of a modulation pulse. In this plasma processing apparatus, when performing a high/low pulse modulation on the high frequency power for plasma generation, if a weighted variable K is set to be 0.5<K<1, a constant reflection wave power $PR_H$ is generated on a high frequency transmission line of a plasma generation system even during a pulse-on period $T_{on}$. Meanwhile, during a pulse-off period $T_{off}$, a reflection wave power $PR_L$ decreases. By adjusting the value of K, a balance between the reflection wave power $PR_H$ during the pulse-on period $T_{on}$ and the reflection wave power $PR_L$ during the pulse-off period $T_{off}$ can be controlled.

11 Claims, 21 Drawing Sheets

(58) Field of Classification Search
USPC .................................................. 315/111.21
See application file for complete search history.

(56) References Cited

U.S. PATENT DOCUMENTS

2015/0122420 A1* 5/2015 Konno .............. H01J 37/32165
                                                      156/345.28
2017/0372873 A1* 12/2017 Yamada ............ H01J 37/32165

* cited by examiner

[ K = 1 ]

[ 0.5 < K < 1 ]

[ K=1 ]

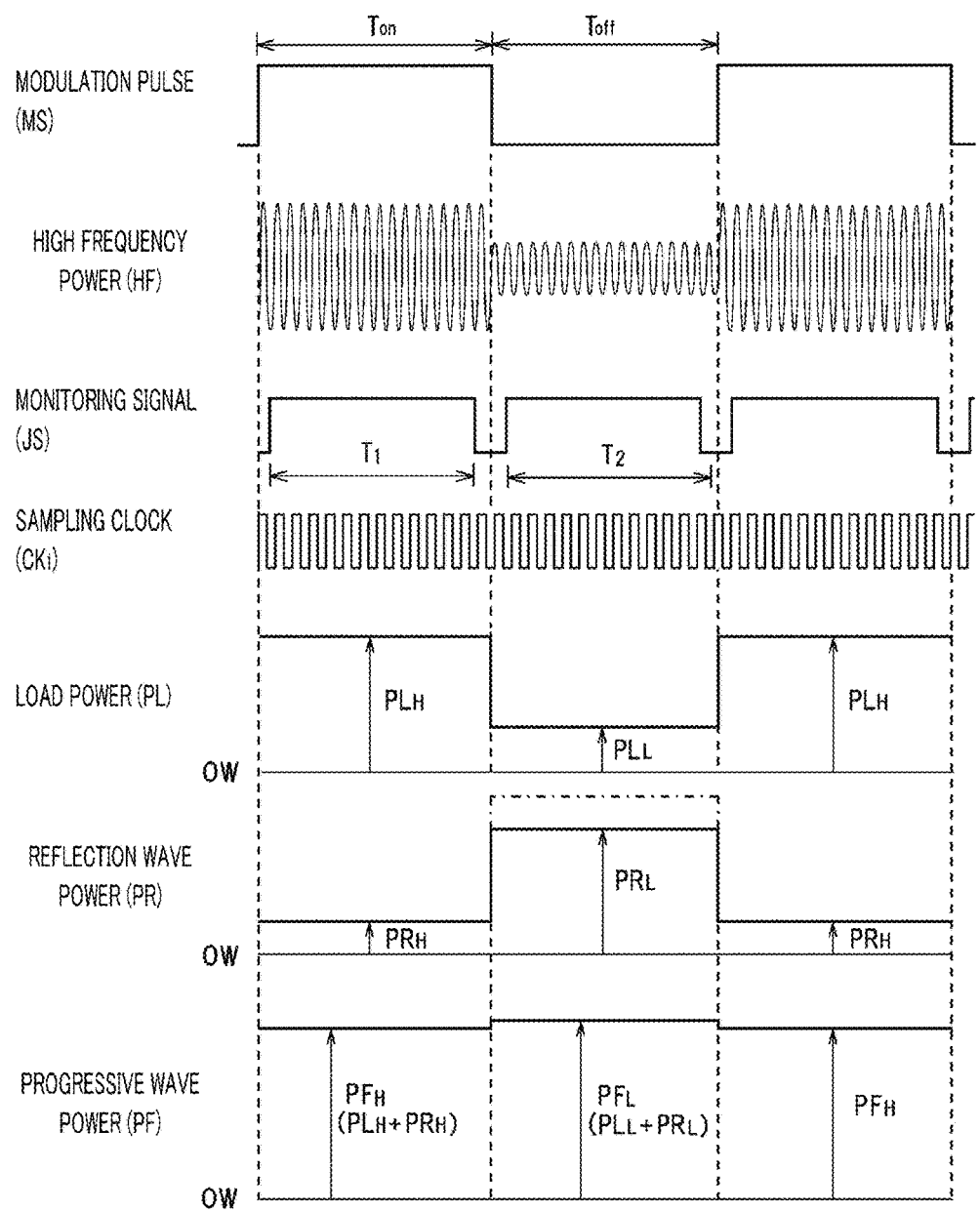

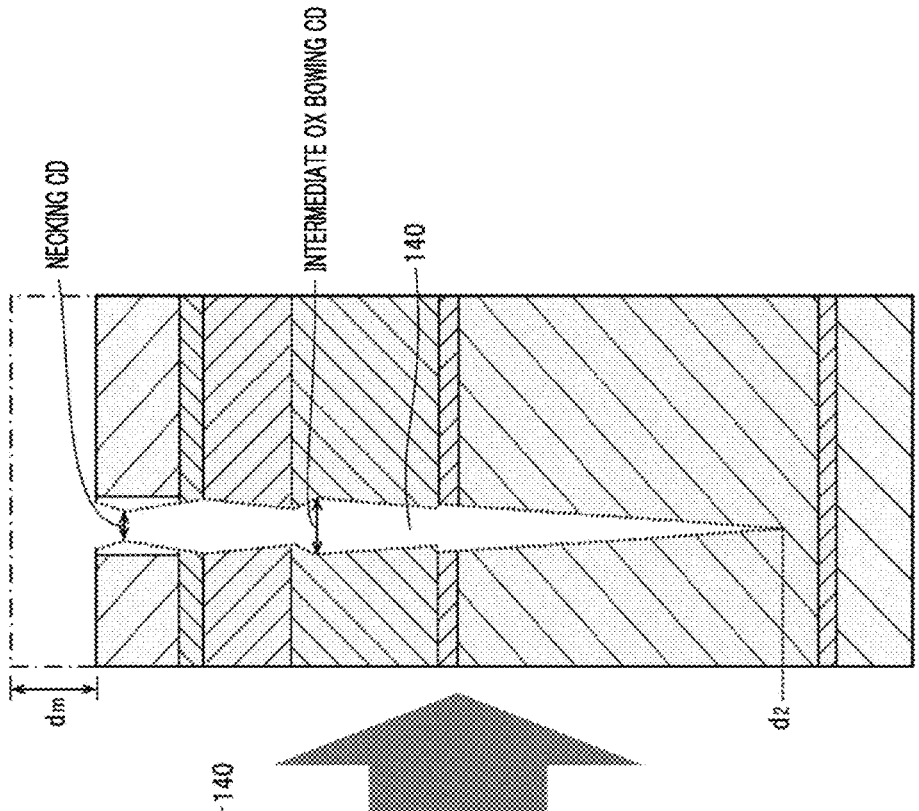
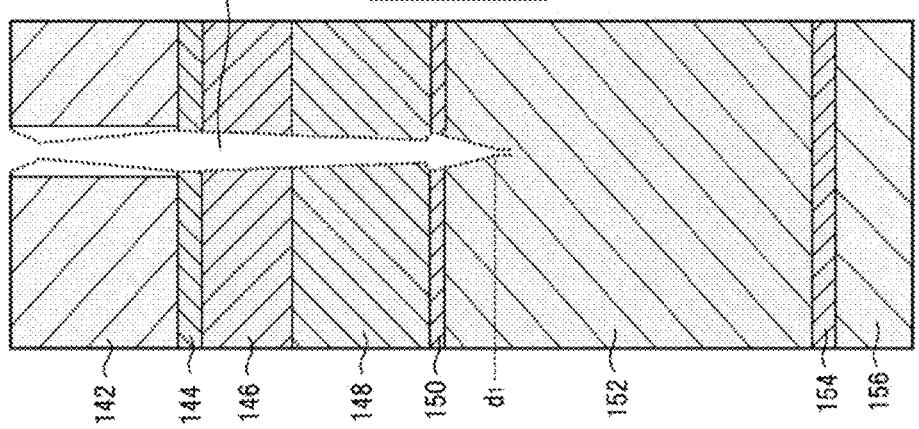

PLASMA PROCESSING APPARATUS

CROSS-REFERENCE TO RELATED APPLICATION

This application claims the benefit of Japanese Patent Application Nos. 2014-188897 and 2015-128277 filed on Sep. 17, 2014 and Jun. 26, 2015, respectively, the entire disclosures of which are incorporated herein by reference.

TECHNICAL FIELD

The embodiments described herein pertain generally to a technique of performing a plasma process on a processing target object; and, more particularly, to a pulse modulation type plasma processing apparatus of pulse-modulating a high frequency power to be used in the plasma process with a pulse having a preset frequency.

BACKGROUND

Generally, in a plasma processing apparatus, plasma of a processing gas is generated within a decompression processing vessel. Further, a thin film is formed on a processing target object within the processing vessel by a gas phase reaction or a surface reaction of radicals or ions included in the generated plasma, or micro-processing such as etching of a material or a thin film on a surface of the processing target object is performed.

A capacitively coupled plasma processing apparatus includes an upper electrode and a lower electrode arranged in parallel to each other within a processing vessel. A processing target object (e.g., a semiconductor wafer, a glass substrate, etc.) is mounted on the lower electrode, and a high frequency power having a frequency (typically, 13.56 MHz or higher) suitable for plasma generation is applied to the upper electrode or the lower electrode. Electrons are accelerated in a high frequency electric field generated between the upper electrode and the lower electrode by applying the high frequency power, and plasma is generated as a result of ionization by collision between the electrons and a processing gas. Further, a RF bias method is widely employed. In this RF bias method, a high frequency power having a relatively low frequency (typically, 13.56 MHz or lower) is applied to the lower electrode on which the processing target object is mounted, and ions in plasma are accelerated and attracted to the processing target object by a negative bias voltage or a sheath voltage generated on the lower electrode. According to this RF bias method, by accelerating the ions in the plasma and bringing them into collision with the surface of the processing target object, a surface reaction, an anisotropic etching or a film modification may be facilitated.

Recently, for the purpose of improving a yield or a processing accuracy of dry-etching, for example, in order to suppress a charging damage (a destroy of a gate oxide film by accumulation of electric charges) or a micro-loading effect (non-uniformity of an etching rate caused by a local difference in a pattern density or a geometrical structure of a pattern), a technique of pulse-modulating a high frequency power for plasma generation and/or a high frequency bias power with a pulse having a preset frequency is widely used.

Generally, in this type of pulse modulation, according to a duty ratio of a modulation pulse, a high frequency power to be pulse-modulated is controlled to be in an on-state of a preset level during a pulse-on period, and controlled to be in an off-state of a zero level during a pulse-off period. Accordingly, when pulse-modulating the high frequency power for plasma generation, for example, plasma is generated and etching progresses during the pulse-on period, whereas the plasma is extinguished and the etching stops temporarily during the pulse-off period. In this case, a matching device provided on a transmission line for supplying the high frequency power for plasma generation measures a load impedance during a pulse-on period within each cycle, and controls a reactance of a variable reactance element provided in a matching circuit such that the load impedance measurement value may be equal to or approximate to a matching point (typically, 50Ω).

Patent Document 1: Japanese Patent Laid-open Publication No. 2012-009544

Patent Document 2: Japanese Patent Laid-open Publication No. 2013-033856

As one example of the above-described pulse modulation in the capacitively coupled plasma processing apparatus, there is known a method of controlling the high frequency power to have a preset high level during the pulse-on period and controlling the high frequency power to have a preset low level lower than the high level during the pulse-off period. Here, the low level is set to be a value higher than the lowest level required to maintain the plasma generation state.

In this high/low pulse modulation method, even during the pulse-off period, certain amounts of electrons, ions, and, also, radicals exist within the processing vessel without being completely extinguished. By using them, by setting the low level of the corresponding high frequency power and other process parameters to appropriate values, chemical or physical actions of the electrons, the ions and/or the radicals on the surface of the processing target object can be controlled, so that a preset etching characteristic is expected to be improved in a certain kind of etching process.

In this high/low pulse modulation method, however, if the frequency of the modulation pulse is set to a high value (typically, 1 kHz or higher), control of the variable reactance element provided in the matching device cannot follow up the modulation pulse. For this reason, a matching operation is performed only during a pulse-high period which dominantly contributes to the plasma process, and the matching operation is not performed during a pulse-low period. If so, during the pulse-low period when the matching operation cannot be performed at all, a large reflection wave is generated on a high frequency transmission line. As a result, it may be difficult to control the high frequency power to be maintained at the preset low level stably and accurately, and, besides, an expected effect of the high/low pulse modulation method on the process may be weakened. Further, a load on a high frequency power supply or the like may be increased.

SUMMARY

In view of the foregoing problems, exemplary embodiments provide a plasma processing apparatus capable of efficiently performing a pulse modulation method of switching a high frequency power in a plasma process between a high level and a low level alternately (especially, at a high frequency) according to a duty ratio of a modulation pulse.

In an exemplary embodiment, a plasma processing apparatus generates plasma by high frequency discharge of a processing gas within a decompression processing vessel that accommodates therein a processing target object, which is loaded into and unloaded from the processing vessel, and performs a process on the processing target object within the processing vessel with the plasma. The plasma processing apparatus includes a first high frequency power supply configured to output a first high frequency power; a first high frequency power modulation unit configured to pulse-modulate an output of the first high frequency power supply with a modulation pulse having a regular frequency such that the first high frequency power has a high level during a first period and has a low level lower than the high level during a second period, the first period and the second period being repeated alternately with a preset duty ratio; a first high frequency transmission line configured to transmit the first high frequency power outputted from the first high frequency power supply to a first electrode provided within or in the vicinity of the processing vessel; and a first matching device configured to measure a load impedance on the first high frequency transmission line with respect to the first high frequency power supply, and configured to match a weighted average measurement value, which is obtained by weighted-averaging a load impedance measurement value during the first period and a load impedance measurement value during the second period with a preset weighted value, with an output impedance of the first high frequency power supply.

In the above configuration, a balance between a reflection wave power during a pulse-high period and a reflection wave power during a pulse-low period can be controlled as required by adjusting a value of a weighted variable for weighted averaging. As a result, the reflection wave powers in the pulse-high/pulse-low periods can be reduced, so that a load power can be set to be a higher value and requirements on the process can be satisfied. Furthermore, a load on a circulator for protecting the high frequency power supply from the reflection wave, or a reflection wave tolerance of the high frequency power supply itself can be reduced. Besides, hardware around the high frequency power supply can be scaled down and simplified, and efficient power consumption thereof can be achieved.

In the plasma processing apparatus according to the exemplary embodiment, with the above-described configuration and operation, it is possible to efficiently perform a pulse modulation method of switching a high frequency power to be used in a plasma process between a high level and a low level alternately (especially, at a high frequency) according to a duty ratio of a modulation pulse.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6B is a diagram showing the waveforms of the respective components when the weighted variable K is set to be 0.5<K<1;

FIG. 9A and FIG. 9B are cross sectional views for describing an HARC process according to the exemplary embodiment;

DETAILED DESCRIPTION

Figure 1:
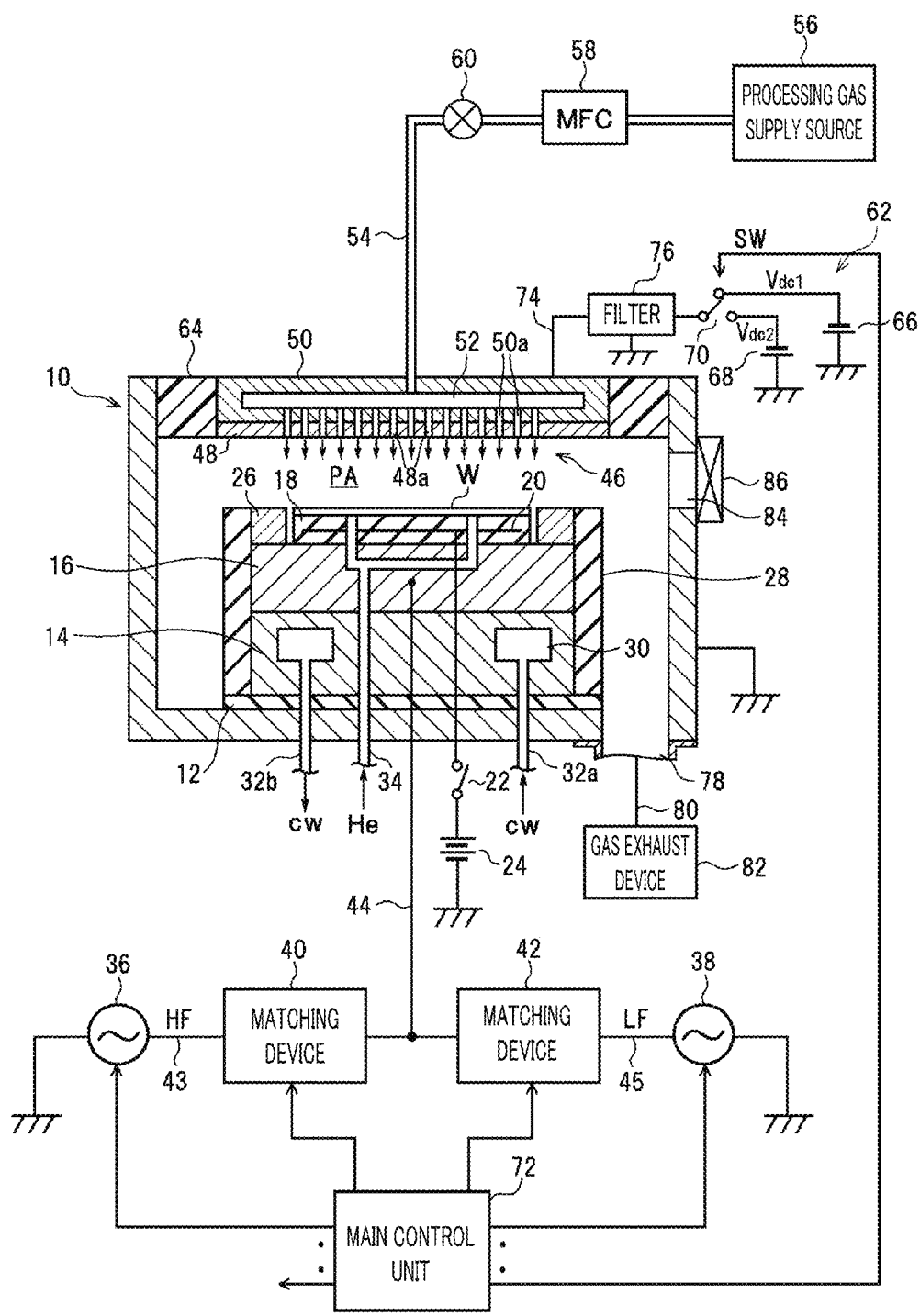
FIG. 1 is a cross sectional view illustrating a configuration of a capacitively coupled plasma processing apparatus configured to apply dual high frequency powers according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings.

<Configuration of Plasma Processing Apparatus>

FIG. 1 shows a configuration of a plasma processing apparatus in accordance with an exemplary embodiment. This plasma processing apparatus is configured as a capacitively coupled (parallel plate type) plasma etching apparatus in which dual high frequency powers are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided via an insulating plate 12 such as ceramic on a bottom of the chamber 10, and a susceptor 16 made of, but not limited to, aluminum is provided on the susceptor supporting member 14. The susceptor 16 serves as a lower electrode, and a processing target object, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic attracting force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water cw from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with high frequency power supplies 36 and 38 via matching devices 40 and 42, respectively, and a common power supply conductor (for example, a power supply rod) 44. One high frequency power supply 36 outputs a high frequency power HF having a frequency $f_{HF}$ (for example, 40 MHz) suitable for plasma generation. Meanwhile, the other high frequency power supply 38 outputs a high frequency power LF having a frequency $f_{LF}$ (for example, 12.88 MHz) suitable for ion attraction to the semiconductor wafer W on the susceptor 16 from the plasma.

As such, the matching device 40 and the power supply rod 44 constitute a part of a high frequency transmission line (high frequency transmission path) 43 configured to transmit the high frequency power HF for plasma generation from the high frequency power supply 36 to the susceptor 16. Meanwhile, the matching device 42 and the power supply rod 44 constitute a part of a high frequency transmission line (high frequency transmission path) 45 configured to transmit the high frequency power LF for ion attraction from the high frequency power supply 38 to the susceptor 16.

An upper electrode 46 is provided at a ceiling of the chamber 10, facing the susceptor 16 in parallel. The upper electrode 46 includes an electrode plate 48 which has a multiple number of gas discharge holes 48a and is made of, e.g., a silicon-containing material such as Si or SiC; and an electrode supporting body 50 which detachably supports the electrode plate 48 and is made of a conductive material such as aluminum having an alumite-treated surface. A processing space or a plasma generation space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The processing gas supply source 56 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the plasma generation space PA toward the semiconductor wafer W on the susceptor 16. In this configuration, the upper electrode 46 also serves as a shower head that supplies the processing gas into the plasma generation space PA.

Further, a passageway (not shown) in which a coolant, e.g., cooling water flows may be provided within the electrode supporting body 50. The entire upper electrode 46, especially, the electrode plate 48 is controlled to have a preset temperature through the coolant by an external chiller unit. Further, in order to stabilize the temperature control over the upper electrode 46, a heater (not shown) including a resistance heating device may be provided within or on a top surface of the electrode supporting body 50.

In the present exemplary embodiment, there is provided a DC power supply unit 62 configured to apply a negative DC voltage $V_{dc}$ to the upper electrode 46. The upper electrode 46 is fixed to an upper portion of the chamber 10 via a ring-shaped insulating body 64 in an electrically floating state. The ring-shaped insulating body 64 is made of, but not limited to, alumina $Al_2O_3$ and hermetically seals a gap between an outer peripheral surface of the upper electrode 46 and a sidewall of the chamber 10, while supporting the upper electrode 46 physically in a non-contact manner.

The DC power supply unit 62 includes two DC power supplies 66 and 68 having different output voltages (absolute values); and a switch 70 configured to selectively connect the DC power supplies 66 and 68 to the upper electrode 46. The DC power supply 66 outputs a negative DC voltage $V_{dc1}$ (e.g., ranging from −2000 V to −1000 V) having a relatively large absolute value, and the DC power supply 68 outputs a negative DC voltage $V_{dc2}$ (e.g., ranging from −300 V to 0 V) having a relatively small absolute value. The switch 70 is operated in response to a switching control signal SW from a main control unit 72, and is switched between a first switching position where the DC power supply 66 is connected to the upper electrode 46 and a second switching operation where the DC power supply 68 is connected to the upper electrode 46. In addition, the switch 70 may further have a third switching position where the upper electrode 46 is disconnected from both of the DC power supply 66 and the DC power supply 68.

A filter circuit 76 provided on a DC power supply line 74 between the switch 70 and the upper electrode 46 is configured to allow the DC voltages $V_{dc1}$ and $V_{dc2}$ from the DC power supply unit 62 to pass therethrough and to be applied to the upper electrode 46. In the meantime, the filter circuit 76 is also configured to allow a high frequency power having reached the DC power supply line 74 through the processing space PA and the upper electrode 46 from the susceptor 16 to be flown to a ground line without being flown to the DC power supply unit 62.

Further, a DC ground part (not shown) made of a conductive material such as, but not limited to, Si or SiC is provided at appropriate position facing the plasma generation space PA within the chamber 10. The DC ground part is constantly grounded via the ground line (not shown).

An annular space formed between the sidewall of the chamber 10, and the susceptor 16 and the susceptor supporting member 14 serves as a gas exhaust space, and a gas exhaust opening 78 of the chamber 10 is formed at a bottom of this gas exhaust space. The gas exhaust opening 78 is connected to a gas exhaust device 82 via a gas exhaust line 80. The gas exhaust device 82 includes a vacuum pump such as a turbo molecular pump and is configured to depressurize an inside of the chamber 10, particularly, the plasma generation space PA to a required vacuum level. Further, a gate valve 86 configured to open and close a loading/unloading opening 84 for the semiconductor wafer W is provided at the sidewall of the chamber 10.

The main control unit 72 includes one or more microcomputers and is configured to control an overall operation (sequence) of an apparatus and individual operations of respective components within the apparatus, particularly, the high frequency power supplies 36 and 38, the matching devices 40 and 42, the MFC 58, the opening/closing valve 60, the DC power supply unit 62, the gas exhaust device 82, etc., according to software (program) and recipes stored in an external memory or an internal memory.

Further, the main control unit 72 is connected to a man-machine interface manipulation panel (not shown) including an input device such as a keyboard and a display device such as a liquid crystal display and, also, connected to an external storage device (not shown) that stores various types of data such as various programs or recipes, set values, etc. In the present exemplary embodiment, the main control unit 72 is configured as a single control unit. However, it may be also possible to adopt a configuration in which multiple control units divide up the functions of the main control unit 72 individually or hierarchically.

A basic operation of single-sheet typed dry etching in the capacitively coupled plasma etching apparatus configured as described above is performed as follows. First, the gate valve 86 is opened, and the semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to a set vacuum pressure by the gas exhaust device 82. Further, the high frequency power HF (40 MHz) for plasma generation and the high frequency power LF (12.88 MHz) for ion attraction from the high frequency power supplies 36 and 38, respectively, are applied to the susceptor 16 at preset powers while overlapped. Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is electrically discharged under a high frequency electric field between the two electrodes 46 and 16, so that plasma is generated in the processing space PA. An etching target film on a main surface of the semiconductor wafer W is etched by radicals or ions included in the plasma.

In this plasma etching apparatus, a first (plasma generation system) power modulation method of pulse-modulating the high frequency power HF for plasma generation outputted from the high frequency power supply 36 with the modulation pulse MS having a regular frequency $f_s$ selected within a range of, for example, 1 kHz to 50 kHz and a variable duty ratio $D_s$ can be performed on the etching process.

For this first power modulation method, there are two types of modes: on/off pulse modulation and high/low pulse modulation. In the on/off pulse modulation mode, according to the duty ratio of the modulation pulse MS, the high frequency power HF for plasma generation is controlled to be in an on-state having a preset level during a pulse-on period, whereas the high frequency power HF is controlled to be in an off-state having a zero (0) level during a pulse-off period. Meanwhile, in the high/low pulse modulation mode, according to the duty ratio of the modulation pulse MS, the high frequency power HF is controlled to be of a high level during the pulse-on period, whereas the high frequency power HF is controlled to be of a low level lower than the high level during the pulse-off period. Here, the low level is selected to be a value higher than the lowest level required to maintain the plasma generation state. Further, the low level is set to be a value (equal to or lower than ½ of the high level), which is apparently lower than the high level.

Further, in this plasma etching apparatus, a second (ion attraction system) power modulation method of pulse-modulating the high frequency power LF for ion attraction outputted from the high frequency power supply 38 with the modulation pulse MS may also be performed on the etching process. Like the first power modulation method, the second power modulation method also has two types of modes: on-off pulse modulation and high/low pulse modulation.

Figure 2:
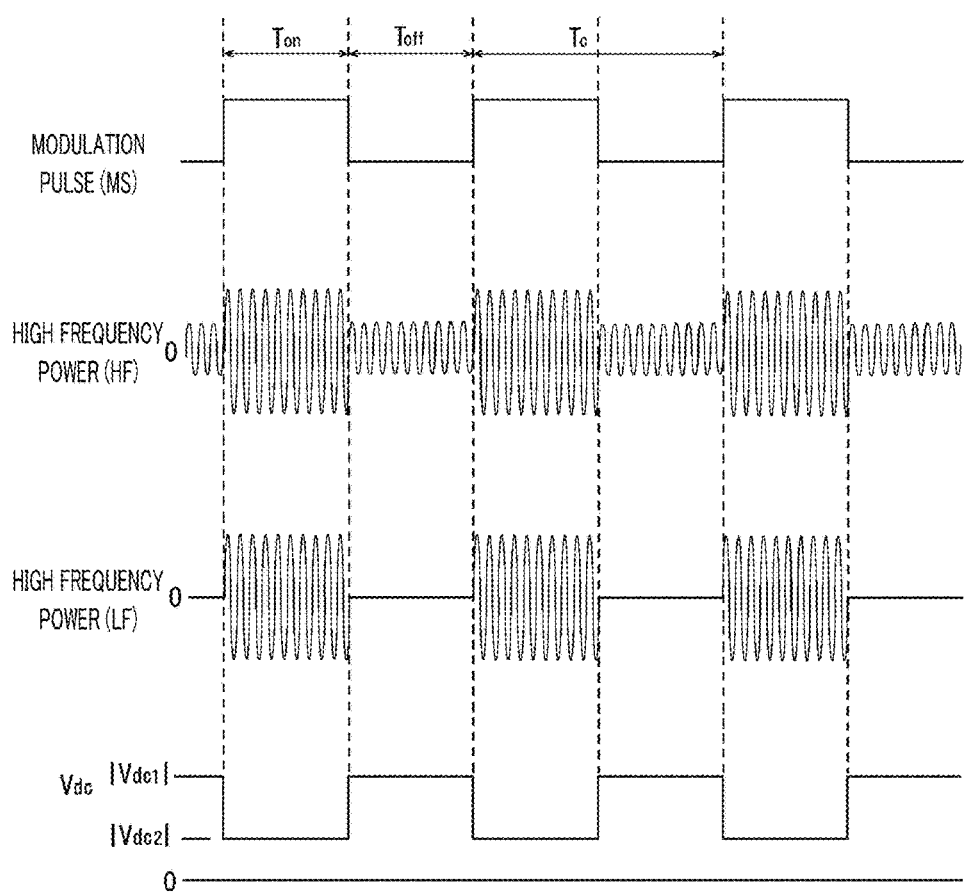
FIG. 2 is a diagram showing typical combinations of waveforms of respective components when performing high/low pulse-modulation on a high frequency power for plasma generation.

FIG. 2 shows example waveforms of respective components when pulse modulations are performed in both the plasma generation system and the ion attraction system synchronously. As shown in this figure, between a cycle $T_c$, an pulse-on period (first period) $T_{on}$ and a pulse-off period (second period) $T_{off}$ of the modulation pulse MS, there is established a relationship of $T_c = T_{on} + T_{off}$. If the frequency of the modulation pulse MS is set to $f_s$, the cycle $T_c$ of the modulation pulse is expressed as $T_c = 1/f_s$, and a duty ratio $D_s$ is expressed as $D_s = T_{on}/(T_{on} + T_{off})$.

In the example shown in FIG. 2, the high/low pulse modulation is performed on the high frequency power HF for plasma generation, whereas the on/off pulse modulation is performed on the high frequency power LF for ion attraction. Further, the application of the DC voltage $V_{dc}$ from the DC power supply unit 62 to the upper electrode 46 may be performed in synchronization with the modulation pulse MS. In the shown example, the DC voltage $V_{dc2}$ having the small absolute value is applied to the upper electrode 46 during the pulse-on period, and the DC voltage $V_{dc1}$ having the large absolute value is applied to the upper electrode 46 during the pulse-off period.

<Configuration of High Frequency Power Supply and Matching Device>

Figure 3:
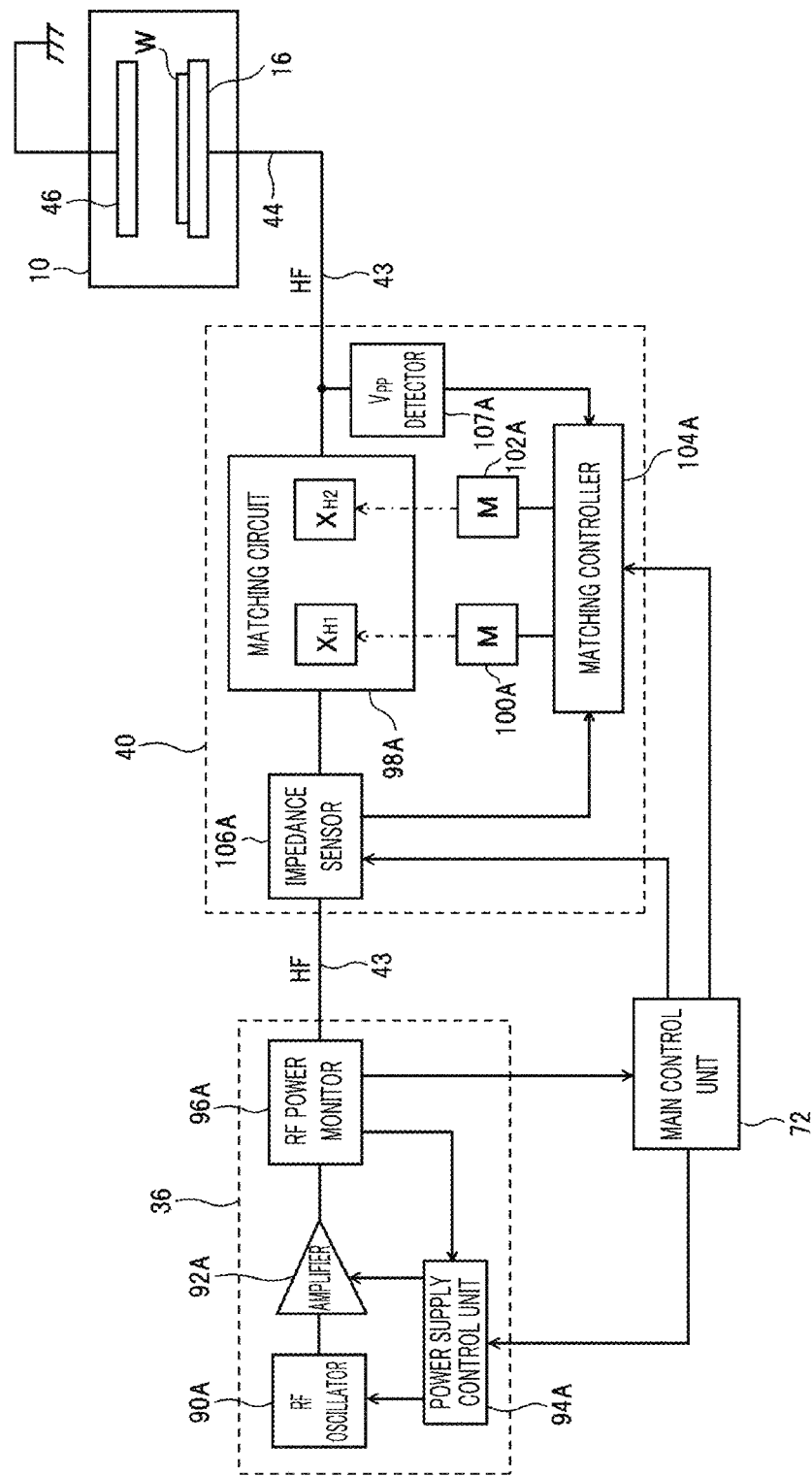
FIG. 3 is a block diagram illustrating a configuration of a matching device and the high frequency power supply for plasma generation.

FIG. 3 illustrates a configuration of the high frequency power supply 36 and the matching device 40 of the plasma generation system.

The high frequency power supply 36 includes a RF oscillator 90A configured to generate a fundamental high frequency sine wave of a regular frequency (for example, 40 MHz) suitable for plasma generation; a power amplifier 92A configured to amplify a power of the fundamental high frequency sine wave outputted from the RF oscillator 90A with a controllable gain or amplification factor; and a power supply control unit 94A configured to directly control the RF oscillator 90A and the power amplifier 92A in response to a control signal from the main control unit 72. The main control unit 72 sends, to the power supply control unit 94A, not only the control signal for instructing the RF output mode and the modulation pulse MS, but also control signals regarding typical power on/off or power interlock relation and data such as power set values. When the pulse modulation (particularly, high/low pulse modulation) is performed on the high frequency power HF for plasma generation, the power supply control unit 94A constitutes pulse modulation unit under the control of the main control unit 72.

The high frequency power supply 36 also includes a RF power monitor 96A. The RF power monitor 96A includes a directional coupler, a progressive wave power monitoring unit, and a reflection wave power monitoring unit (which are not illustrated). Herein, the directional coupler is configured to extract signals corresponding to a power of a progressive wave propagating on the high frequency transmission line 43 in a forward direction and a power of a reflection wave propagating on the high frequency transmission line 43 in a backward direction. The progressive wave power monitoring unit is configured to output a progressive wave power measurement signal indicating the power of the progressive wave included in the progressive wave propagating on the high frequency transmission line 43 based on the progressive wave power detection signal extracted by the directional coupler. This progressive wave power measurement signal is sent to the power supply control unit 94A within the high frequency power supply 36 for power feedback control and also sent to the main control unit 72 for monitor display. The reflection wave power monitoring unit is configured to measure a power of a reflection wave returning back to the high frequency power supply 36 from plasma within the chamber 10. The reflection wave power measurement value outputted from the reflection wave power monitoring unit is sent to the main control unit 72 for monitor display and also sent to the power supply control unit 94A within the high frequency power supply 36 as a monitor value for protecting the power amplifier.

The matching device 40 includes a matching circuit 98A including multiple, for example, two controllable reactance elements (for example, variable capacitors or variable inductors) $X_{H1}$ and $X_{H2}$ connected to the high frequency transmission line 43; a matching controller 104A configured to control reactances of the reactance elements $X_{H1}$ and $X_{H2}$ via actuators such as motors (M) 100A and 102A; an impedance sensor 106A configured to measure load impedance including impedance of the matching circuit 98A on the high frequency transmission line 43; and a $V_{pp}$ detector 107A configured to measure a peak-to-peak value $V_{pp}$ of the high frequency power HF on the high frequency transmission line 43 at the side of an output terminal of the matching circuit 98A. An internal configuration and an operation of the impedance sensor 106A and a function of the $V_{pp}$ detector 107A will be described in detail later.

The high frequency power supply 38 (see FIG. 1) of the ion attraction system has the same configuration as that of the above-described high frequency power supply 36 for plasma generation system except that the frequency of the high frequency power LF is different from that of the high frequency power HF. That is, the high frequency power supply 38 of the ion attraction system includes a RF oscillator 90B, a power amplifier 92B, a power supply control unit 94B (not shown) and a RF power monitor 96B. Further, the matching device 42 also includes, like the matching device 40 of the plasma generation system, a matching circuit 98B, motors (M) 100B and 102B, a matching controller 104B, an impedance sensor 106B and a $V_{pp}$ detector 107B (not shown).

<Configuration of Impedance Sensor>

Figure 4A:
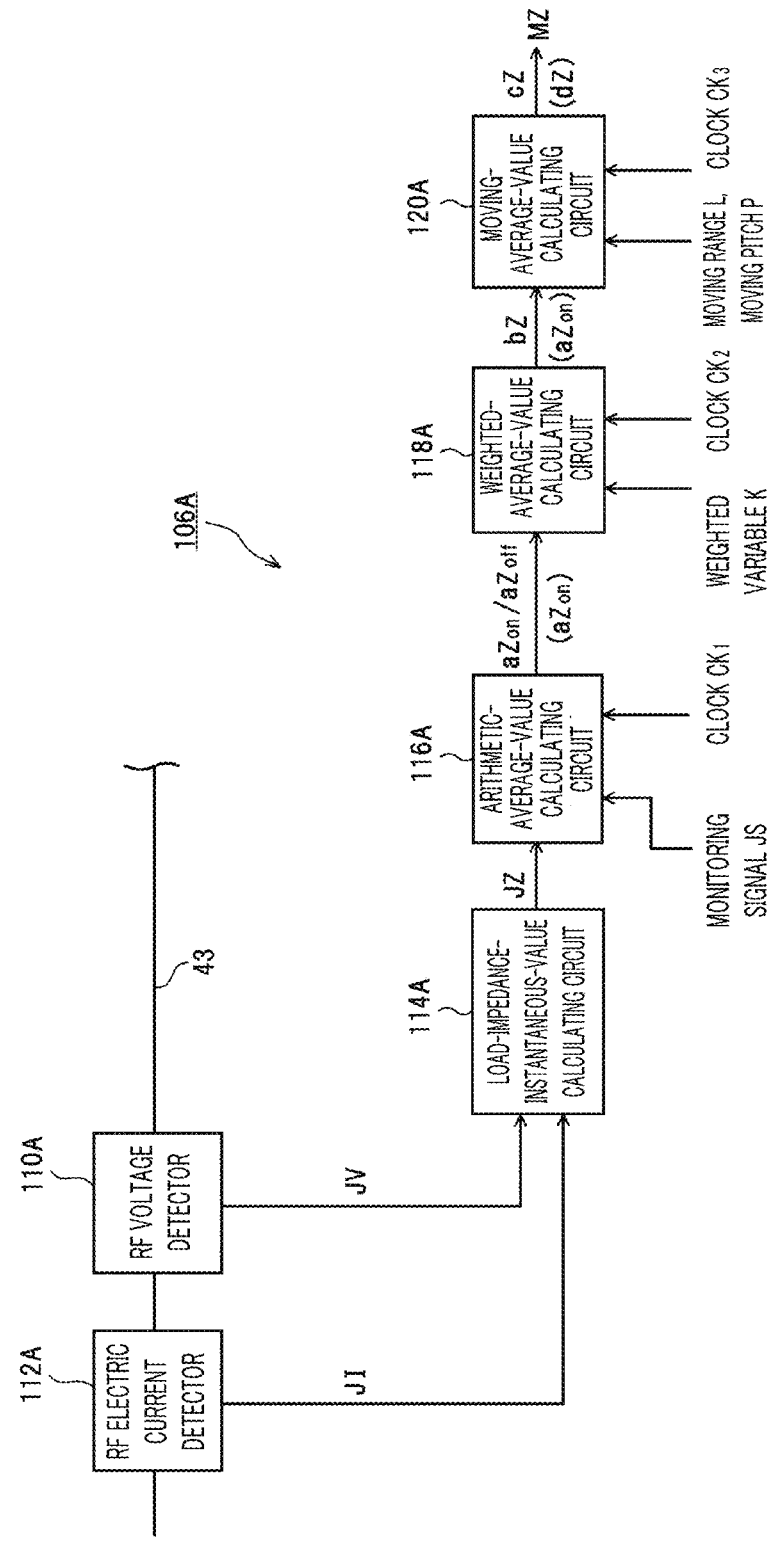
FIG. 4A is a block diagram illustrating a configuration example of an impedance sensor provided in the matching device of FIG. 3.

FIG. 4A depicts a configuration example of the impedance sensor 106A provided within the matching device 40 of the plasma generation system. This impedance sensor 106A includes a RF voltage detector 110A; a RF electric current detector 112A; a load-impedance-instantaneous-value calculating circuit 114A; an arithmetic-average-value calculating circuit 116A; a weighted-average-value calculating circuit 118A and a moving-average-value calculating unit 120A.

The RF voltage detector 110A and the RF electric current detector 112A are configured to detect a voltage and an electric current of the high frequency power HF on the high frequency transmission line 43, respectively. The load-impedance-instantaneous-value calculating circuit 114A is configured to calculate an instantaneous value JZ of a load impedance Z on the high frequency transmission line 43 based on a voltage detection signal JV and an electric current detection signal JI obtained from the RF voltage detector 110A and the RF electric current detector 112A, respectively. Desirably, the load-impedance-instantaneous-value calculating circuit 114A may be a digital circuit, though it may be implemented by an analog circuit as well.

When performing the high/low pulse modulation on the high frequency power HF for plasma generation, in each cycle of the modulation pulse MS, the arithmetic-average-value calculating circuit 116A samples instantaneous values JZ of the load impedance Z from the load-impedance-instantaneous-value calculating circuit 114A with a preset sampling frequency $f_c$ during the pulse-on period $T_{on}$, and calculates an arithmetic average value $aZ_{on}$ of the load impedance Z during the pulse-on period $T_{on}$. Further, the arithmetic-average-value calculating circuit 116A also samples instantaneous values JZ of the load impedance Z from the load-impedance-instantaneous-value calculating circuit 114A with the preset sampling frequency $f_c$ during the pulse-off period $T_{off}$, and calculates an arithmetic average value $aZ_{off}$ of the load impedance Z during the pulse-off period $T_{off}$.

Meanwhile, when performing the on/off pulse modulation on the high frequency power HF for plasma generation, in each cycle of the modulation pulse MS, the arithmetic-average-value calculating circuit 116A samples instantaneous values JZ of the load impedance Z from the load-impedance-instantaneous-value calculating circuit 114A with the preset sampling frequency $f_c$ only during the pulse-on period $T_{on}$, and calculates an arithmetic average value $aZ_{on}$ of the load impedance Z during the pulse-on period $T_{on}$.

The main control unit 72 (FIG. 1) sends a monitoring signal JS indicating a sampling time or a monitoring time in synchronization with the modulation pulse MS and a sampling clock $CK_1$ to the arithmetic-average-value calculating circuit 116A. Here, as for the monitoring signal JS, the monitoring times $T_1$ and $T_2$ to be described later are set for both of the pulse-on period $T_{on}$ and the pulse-off period $T_{off}$, respectively, in the high/low pulse modulation of the high frequency power HF for plasma generation, whereas a monitoring time $T_1$ is set only for the pulse-on period $T_{on}$ in the on/off pulse modulation of the high frequency power HF. The arithmetic-average-value calculating circuit 116A is required to process a large quantity of signals at a high frequency in synchronization with the sampling clock $CK_1$ of several tens of MHz, and, thus, a FPGA (field programmable gate array) can be used appropriately.

The weighted-average-value calculating circuit 118A is appropriately composed of a CPU. When performing the high/low pulse modulation on the high frequency power HF for plasma generation, the weighted-average-value calculating circuit 118A weighted-averages the arithmetic average value $aZ_{on}$ of the load impedance Z during the pulse-on period $T_{on}$ and the arithmetic average value $aZ_{off}$ of the load impedance Z during the pulse-off-period $T_{off}$ obtained from the arithmetic-average-value calculating circuit 116A with a preset weighted value (weighted variable K), and thus calculates a weighted average value bZ of the load impedance for a single cycle. The main control unit 72 sends a clock $CK_2$ and the weighted variable K for the weighted averaging to the weighted-average-value calculating circuit 118A.

Meanwhile, when performing the on/off pulse modulation on the high frequency power HF, the weighted-average-value calculating circuit 118A is not operated, and the arithmetic average value $aZ_{on}$ of the load impedance Z during the pulse-on period $T_{on}$ outputted from the arithmetic-average-value calculating circuit 116A is sent to the moving-average-value calculating circuit 120A at the rear end without passing through the weighted-average-value calculating circuit 118A.

The moving-average-value calculating circuit 120A is appropriately composed of a CPU. In the high/low pulse modulation of the high frequency power HF for plasma generation, a moving weighted average value cZ of the load impedance Z is calculated based on the multiple consecutive weighted average values bZ of the load impedance for the single cycle obtained from the weighted-average-value calculating circuit 118A.

Further, in the on/off pulse modulation of the high frequency power HF, the moving-average-value calculating circuit 120A calculates a moving average value dZ based on the multiple consecutive arithmetic average values $aZ_{on}$ of the load impedance Z during the pulse-on period $T_{on}$ outputted from the arithmetic-average-value calculating circuit 116A, and outputs this moving average value dZ as a measurement value MZ of the load impedance Z. The main control unit 72 sends a clock $CK_3$ and set values of a moving range L and a moving pitch P to the moving-average-value calculating circuit 120A.

The load impedance measurement value MZ outputted from the moving-average-value calculating circuit 120A is updated in synchronization with the clock $CK_3$. Typically, the load impedance measurement value MZ includes an absolute value and a phase measurement value of the load impedance Z.

Figure 4B:
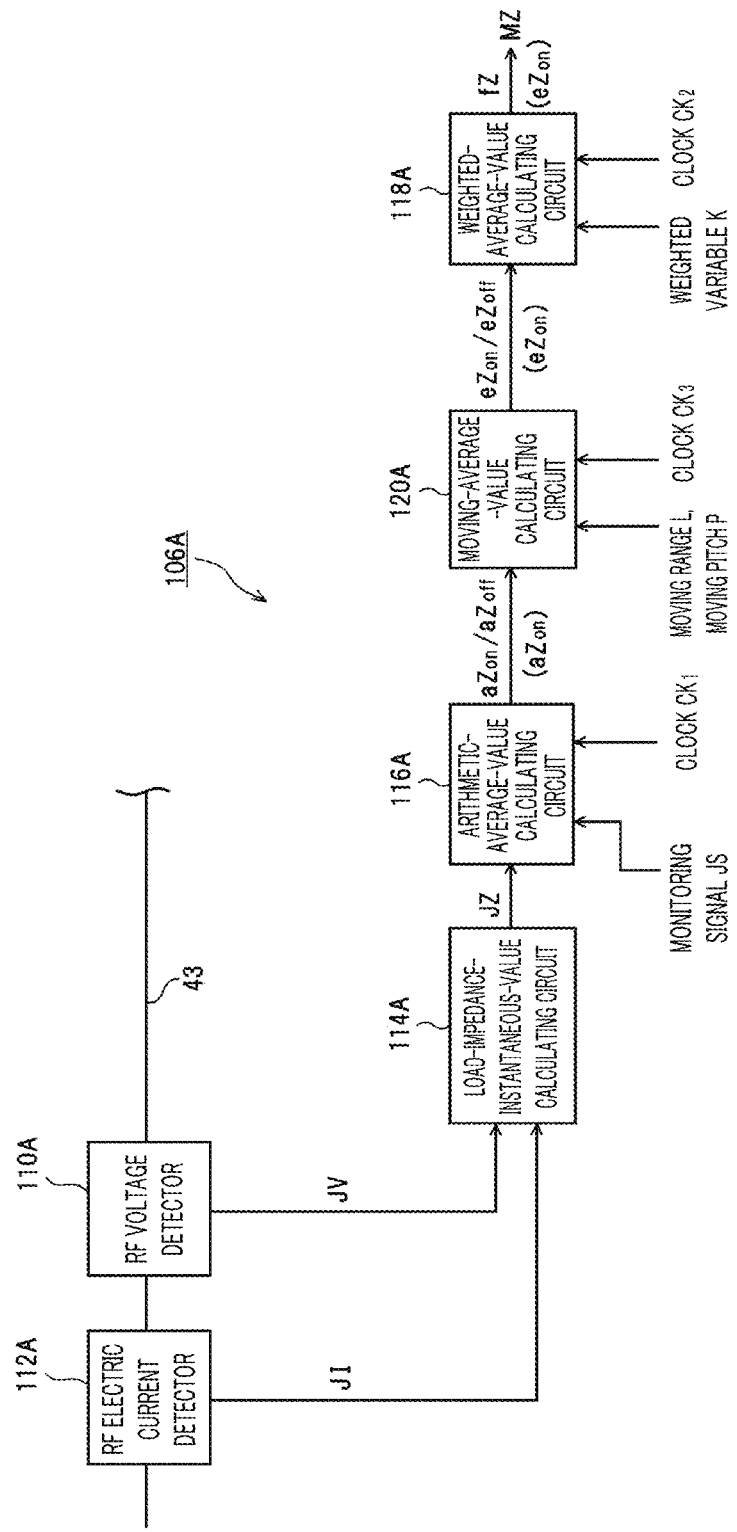
FIG. 4B is a block diagram illustrating another configuration example of the impedance sensor.

FIG. 4B depicts another configuration example of the impedance sensor 106A. As shown in this figure, the weighted-average-value calculating circuit 118A may be provided at the rear end of the moving-average-value calculating circuit 120A. In this configuration example, when performing the high/low pulse modulation on the high frequency power HF for plasma generation, the moving-average-value calculating circuit 120A calculates a moving average value $eZ_{on}$ of the load impedance Z during the pulse-on period $T_{on}$ and a moving average value $eZ_{off}$ of the load impedance Z during the pulse-off period $T_{off}$ based on the multiple (n number of) consecutive arithmetic average values $aZ_{on}$ of the load impedance Z during the pulse-on period $T_{on}$ and the multiple (n number of) consecutive arithmetic average values $aZ_{off}$ of the load impedance Z during the pulse-off period $T_{off}$ obtained from the arithmetic-average-value calculating circuit 116A.

The weighted-average-value calculating circuit 118A calculates a weighted moving average value fZ of the load impedance Z by weighted-averaging the moving average value $eZ_{on}$ of the load impedance Z during the pulse-on period $T_{on}$ and the moving average value $eZ_{off}$ of the load impedance Z during the pulse-off period $T_{off}$, which are obtained from the moving-average-value calculating circuit 120A, with the preset weighted value (weighted variable K). Then, the weighted-average-value calculating circuit 118A outputs the weighted moving average value fZ as the load impedance measurement value MZ.

When performing the on/off pulse modulation on the high frequency power HF for the plasma generation, on the other hand, the weighted-average-value calculating circuit 118A is not operated, and the moving average value $eZ_{on}$ of the load impedance Z during the pulse-on period $T_{on}$, which is outputted from the moving-average-value-calculating circuit 120A, is outputted as the load impedance measurement value MZ.

The matching device 42 of the ion attraction system (FIG. 1) is equipped with the impedance sensor 106B (not shown), like the impedance sensor 106A within the matching device 40 of the above-described plasma generation system. That is, the matching device 42 includes a RF voltage detector 110B, a RF electric current detector 112B, a load-impedance-instantaneous-value calculating circuit 114B, an arithmetic-average-value calculating circuit 116B, a weighted-average-value calculating circuit 118B and a moving-average-value calculating circuit 120B. In this impedance sensor 106B, the same as described above, signal processings within the weighted-average-value calculating circuit 118B and the moving-average-value-calculating circuit 120B are switched according to the mode (high/low or on/off) of the pulse modulation that is performed on the high frequency power LF for ion attraction.

<Operation of Matching Device>

Here, when performing the /low pulse modulation on the high frequency power HF for plasma generation, an operation of the matching device 40 of the plasma generation system will be explained. Further, the on/off pulse modulation is performed on the high frequency power LF for ion attraction with the same modulation pulse MS.

In this case, the high frequency power HF is continuously transmitted on the high frequency transmission line 43 of the plasma generation system toward a plasma load within the chamber 10 during the pulse-off period $T_{off}$ as well as during the pulse-on period $T_{on}$. In the ion attraction system, however, since the high frequency power LF is turned on and off in synchronization with the duty ratio of the modulation pulse MS, the plasma load with respect to the matching device 40 of the plasma generation system changes greatly between the pulse-on period $T_{on}$ and the pulse-off period $T_{off}$. For this reason, if the frequency of the modulation pulse MS is set to be a high value (typically, 1 kHz or higher), an auto-matching operation of adjusting reactances of the reactance elements $X_{H1}$ and $X_{H2}$ through the motors 100A and 102A under the control of the matching controller 104A cannot follow up the modulation pulse MS in the matching device 40 of the plasma generation system.

In the present exemplary embodiment, however, even if the frequency of the modulation pulse MS is set to be so high that the auto-matching operation of the matching device 40 may not follow up, a balance in the degree of matching or mismatching between the pulse-on period $T_{on}$ and the pulse-off period $T_{off}$ is controlled by the special signal processing within the impedance sensor 106A to be described below. Thus, the high/low pulse modulation can be performed effectively and stably.

In this case, the main control unit 72 sends a control signal, set values and a timing signal to the power supply control unit 94A of the high frequency power supply 36 of the plasma generation system such that the high frequency power HF has a preset high level power and a preset low level power, alternately, according to the duty ratio of the modulation pulse MS. Further, the main control unit 72 sends the monitoring signal JS, the weighted variable K, the set values L and P for moving average value calculation and the clocks $CK_1$, $CK_2$ and $CK_3$ required for the high/low pulse modulation to the impedance sensor 106A within the matching device 40.

Meanwhile, the main control unit 72 sends a control signal, set values and a timing signal to the power supply control unit 94B of the high frequency power supply 38 of the ion attraction system such that the high frequency power LF i has a preset on-level (on-state) and a zero level (off-state), alternately, according to the duty ratio of the modulation pulse MS. Further, the main control unit 72 sends the monitoring signal JS, the weighted variable K, the set values L and P for moving average value calculation and the clocks $CK_1$, $CK_2$ and $CK_3$ required for the on/off pulse modulation to the impedance sensor 106B within the matching device 42.

Figure 6A:
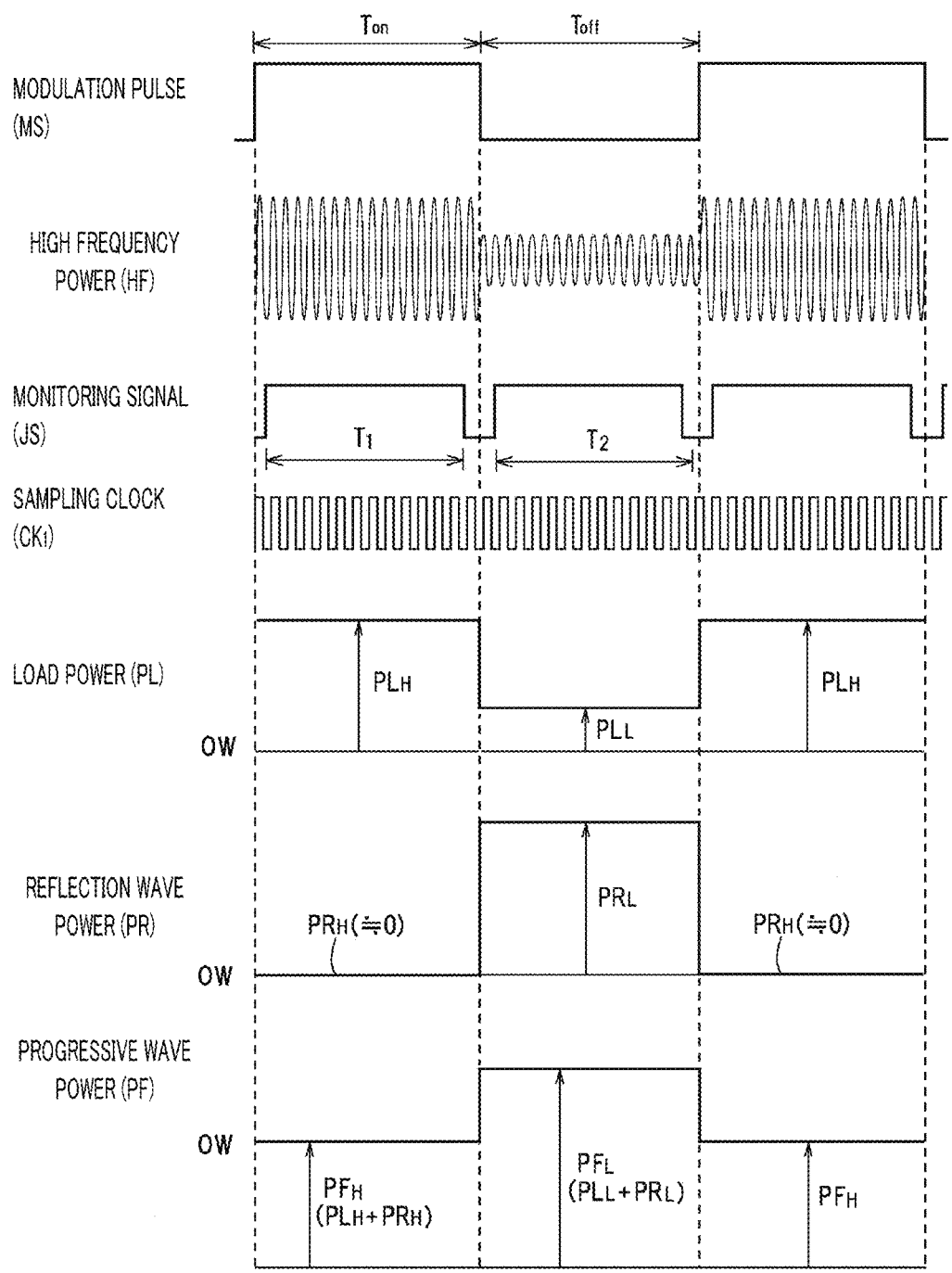
FIG. 6A is a diagram showing waveforms of respective components when the weighted variable K is set to be K=1.

In the matching device 40 of the plasma generation system, as depicted in FIG. 6A or FIG. 6B, the monitoring times $T_1$ and $T_2$ are set within the pulse-on period $T_{on}$ and the pulse-off period $T_{off}$ in each cycle of the modulation pulse MS, respectively. Desirably, within the pulse-on period $T_{on}$, the monitoring time $T_1$ is set within a time range excluding transient times immediately after the starting of the pulse-on period $T_{on}$ and immediately before the ending thereof, i.e., when the reflection wave power on the high frequency transmission line 43 is rapidly changed. Likewise, within the pulse-off period $T_{off}$, the monitoring time $T_2$ is set within a time range excluding transient times immediately after the starting of the pulse-off period $T_{off}$ and immediately before the ending thereof.

Also, in each cycle of the modulation pulse MS, the arithmetic-average-value calculating circuit 116A within the impedance sensor 106A samples the instantaneous values JZ of the load impedance Z from the load-impedance-instantaneous-value calculating circuit 114A with the sampling clock $CK_1$ during the pulse-on period $T_{on}$, and calculates the arithmetic average value $aZ_{on}$ of the load impedance Z during the pulse-on period $T_{on}$. Further, the arithmetic-average-value calculating circuit 116A samples the instantaneous values JZ of the load impedance Z from the load-impedance-instantaneous-value calculating circuit 114A with the sampling clock $CK_1$ during the pulse-off period $T_{off}$, and calculates the arithmetic average value $aZ_{off}$ of the load impedance Z during the pulse-off period $T_{off}$.

The weighted-average-value calculating circuit 118A calculates a weighted average value bZ of the load impedance for the single cycle by weighted-averaging the arithmetic average value $aZ_{on}$ of the load impedance Z during the pulse-on period $T_{on}$ and the arithmetic average value $aZ_{off}$ of the load impedance Z during the pulse-off period $T_{off}$ from the arithmetic-average-value calculating circuit 116A with the preset weighted value (weighted variable K). Here, the weighted variable K is selected within a range of $0 \le K \le 1$, and the weighted average value bZ is represented by the following equation (1).

$$bZ = K^* aZ_{on} + (1-K)^* aZ_{off} \qquad (1)$$

When performing the high/low pulse modulation on the high frequency power HF for plasma generation, the moving-average-value calculating circuit 120A calculates a moving weighted average value cZ of the weighted average values bZ with the preset moving range L and the preset moving pitch P based on the multiple (n number of) consecutive weighted average values bZ of the load impedance Z for the single cycle outputted from the weighted-average-value calculating circuit 118A. By way of example, when the frequency $f_s$ of the modulation pulse MS is 1000 Hz, if the moving range L and the moving pitch P are set to be 10 msec and 2 msec, respectively, one moving weighted average value cZ is calculated for 10 consecutive weighted average values bZ for the single cycle every 2 msec.

The moving-average-value calculating circuit 120A outputs this moving weighted average value cZ as a load impedance measurement value MZ. The load impedance measurement value MZ depends on the value of the weighted variable K applied to the weighted-average-value calculating circuit 118A from the main control unit 72 and does not depend on a duty ratio $D_s$ of the modulation pulse MS.

The matching controller 104A within the matching device 40 follows up and responds to the load impedance measurement value MZ outputted from the moving-average-value calculating circuit 120A of the impedance sensor 106A with the cycle of the clock $CK_3$, and controls the motors 100A and 102A to adjust the reactances of the reactance elements $X_{H1}$ and $X_{H2}$ within the matching circuit 98A such that a phase of the load impedance measurement value MZ is zero (0) and an absolute value thereof is 50Ω, i.e., such that the load impedance measurement value MZ is equal to or approximate to a matching point $Z_s$.

As stated above, the matching device 40 performs a matching operation such that the load impedance measurement value MZ outputted from the impedance sensor 106A is equal to or approximate to the matching point $Z_s$. That is, the load impedance measurement value MZ is a matching target point. Accordingly, the arithmetic average value $aZ_{on}$ of the load impedance Z during the pulse-on period $T_{on}$ and the arithmetic average value $aZ_{off}$ of the load impedance Z during the pulse-off period $T_{off}$ are offset from the matching point $Z_s$ by a ratio of $(1-K):K$ depending on the value of the weighted variable K for the weighted averaging.

Figure 5A:
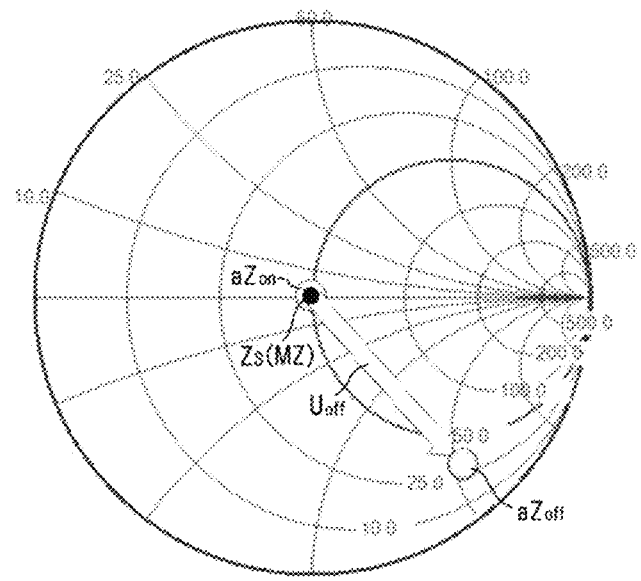
FIG. 5A is a Smith chart for describing a matching operation when a weighted variable K for weighted averaging is set to be K=1 according to the exemplary embodiment.

Here, if the weighted variable K applied to the impedance sensor 106A of the matching device 40 from the main control unit 72 is set to be K=1, the weighted factor (K) for $aZ_{on}$ of the first term on the right side of the equation (1) for the weighted averaging has the maximum value "1," and the weighted factor (1−K) for $aZ_{off}$ of the second term has the minimum value "0 (zero)". As shown on a Smith chart of FIG. 5A, the arithmetic average value $aZ_{on}$ of the load impedance Z during the pulse-on period $T_{on}$ is equal to or approximate to the matching point $Z_s$. Meanwhile, the arithmetic average value $aZ_{off}$ of the load impedance Z during the pulse-off period $T_{off}$ is offset furthest from the matching point $Z_s$.

As stated above, when K=1, the approximately complete matching is achieved during the pulse-on period $T_{on}$ on the high frequency transmission line 43 of the plasma generation system, as schematically depicted in the waveform diagrams of FIG. 6A. Thus, a reflection wave power $PR_H$ does not appear, and a progressive wave power $PF_H$ itself becomes a load power $PL_H$. Meanwhile, during the pulse-off period $T_{off}$, since the mismatching degree is highest, a reflection wave power $PR_L$ has a very high level, and, accordingly, a progressive wave power $PF_L$ becomes much higher than the load power $PL_L$.

Further, in the present exemplary embodiment, as for the control of the high frequency power HF, the high frequency power supply 36 is configured to selectively perform a PF control of maintaining a progressive wave power PF at a constant value or a PL control of maintaining a net input power (load power), which is obtained by subtracting a reflection wave power PR from the progressive wave power PF, at a constant value. However, when performing the high/low pulse modulation on the high frequency power HF, it may be desirable to perform the PL control in which a power of a low level set to be of a low value can be inputted to a load securely and stably at least during the pulse-off period $T_{off}$. Under the condition of K=1, however, if the PL control is performed, the matching is not achieved at all during the pulse-off period $T_{off}$, as in the prior art. As a result, the reflection wave power $PR_L$ increases remarkably, as depicted in FIG. 6A.

Figure 5B:
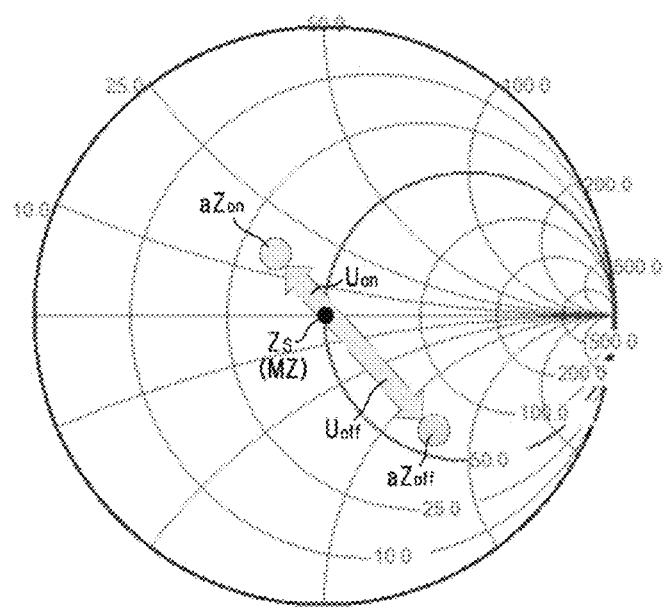
FIG. 5B is a smith chart for describing the matching operation when the weighted variable K for weighted averaging is selected within a range of 0.5<K<1.

In the present exemplary embodiment, the aforementioned problems can be solved by setting the weighted variable K within a range of 0.5<K<1. That is, when 0.5<K<1, the weighted factor (K) for $aZ_{on}$ of the first term on the right side of the equation (1) for the weighted averaging is smaller than the maximum value "1," and, accordingly, the weighted factor (1−K) for $aZ_{off}$ of the second term is larger than the minimum value "0 (zero)". Thus, as shown in a Smith chart of FIG. 5B, the arithmetic average value $aZ_{on}$ of the load impedance Z during the pulse-on period $T_{on}$ is offset from the matching point $Z_s$, and by the offset amount, the arithmetic average value $aZ_{off}$ of the load impedance Z during the pulse-off period $T_{off}$ approximates to the matching point $Z_s$.

Here, the matching point $Z_s$ lies on a straight line (intermediate point) that connects the load impedance measurement values (arithmetic average values) $aZ_{on}$ and $aZ_{off}$ during the two periods $T_{on}$ and $T_{off}$ on the Smith chart. Further, as the value of K is set to be offset further from 1 (or closer to 0.5), the load impedance measurement value $aZ_{on}$ during the pulse-on period $T_{on}$ is offset further from the matching point $Z_s$, whereas the load impedance measurement value $aZ_{off}$ during the pulse-off period $T_{off}$ approximates to the matching point Z.

As stated above, when the weighted variable K is set to be 0.5<K<1, a reflection wave of a constant power $PR_H$ is generated on the high frequency transmission line 43 of the plasma generation system even during the pulse-on period $T_{on}$, as schematically depicted in the waveform diagrams of FIG. 6B. Meanwhile, during the pulse-off period $T_{off}$, the reflection wave power $PR_L$ decreases, as compared to the reflection wave power when K=1. By adjusting the value of K, a balance between the reflection wave power $PR_H$ during the pulse-on period $T_{on}$ and the reflection wave power $PR_L$ during the pulse-off period $T_{off}$ can be controlled as required.

Accordingly, the reflection wave power $PR_L$ during the pulse-off period $T_{off}$ can be reduced, and, as much as the reflection wave power is reduced, the load power $PL_L$ can be set to be a higher value, thus satisfying requirements on the process. Furthermore, a load on a circulator for protecting the high frequency power supply 36 from the reflection wave or a reflection wave tolerance of the high frequency power supply 36 itself can also be reduced. Besides, hardware around the high frequency power supply 36 can be scaled down and simplified, and efficient power consumption can be achieved. In addition, by reducing the reflection wave power $PR_L$, the PL control for maintaining a net high frequency power (load power) PL inputted to the plasma load at a set value, as will be described later, can be performed more accurately and more efficiently.

Further, the weighted variable K may not be limited to the range of 0.5<K≤1 but may be set within a range of 0≤K≤0.5. When K=0.5, the weighted factor (K) for $aZ_{on}$ of the first term on the right side of the equation (1) for the weighted averaging and the weighted factor (1−K) for $aZ_{off}$ of the second term of the equation (1) are both equal to 0.5. Though not shown, the matching point $Z_s$ is located on the midpoint between the load impedance measurement value $aZ_{on}$ during the pulse-on period $T_{on}$ and the load impedance measurement value $aZ_{off}$ during the pulse-off period $T_{off}$.

Further, when 0≤K<0.5, since the weighted factor (K) for $aZ_{on}$ of the first term on the right side of the equation (1) for the weighted averaging is smaller than the weighted factor (1−K) for $aZ_{off}$ of the second term of the equation (1), the load impedance measurement value $aZ_{on}$ during the pulse-on period $T_{on}$ is relatively offset further from the matching point $Z_s$, whereas the load impedance measurement value $aZ_{off}$ is relatively approximate to the matching point Z. In this case, the reflection wave power $PR_L$ during the pulse-off period $T_{off}$ relatively decreases, whereas the reflection wave power $PR_H$ during the pulse-on period $T_{on}$ relatively increases.

As stated above, according to the exemplary embodiment, the balance between the reflection wave power $PR_H$ during the pulse-on period $T_{on}$ and the reflection wave power $PR_L$ during the pulse-off period $T_{off}$ (or the balance in the degree of matching or mismatching between these two periods) can be adjusted as required, independently from the duty ratio $D_s$ of the modulation pulse MS. The main control unit 72 may set the weighted variable K for a process recipe to be in the range from $0 \leq K \leq 1$, and may change the weighted variable K for each of the processes or may vary the weighted variable K in the step shape or continuously for the single process.

Further, in the matching device 42 of the ion attraction system, since the on/off pulse modulation is performed on the high frequency power LF, the weighted variable K is not assigned to the impedance sensor 106B from the main control unit 72, and the weighted-average-value calculating circuit 118B is not operated. The moving-average-value calculating circuit 120B calculates a moving average value dZ based on the multiple (n number of) consecutive arithmetic average values $aZ_{on}$ of the load impedance Z during the pulse-on period $T_{on}$, which are outputted from the arithmetic-average-value calculating circuit 116B, for every cycle of the clock $CK_1$, and outputs this moving average value dZ as a measurement value MZ of the load impedance Z.

The matching controller 104B within the matching device 42 follows up and responds to the load impedance measurement value MZ outputted from the moving-average-value calculating circuit 120B of the impedance sensor 106B with the cycle of the clock $CK_3$, and controls the motors 100B and 102B to adjust the reactances of the reactance elements $X_{L1}$ and $X_{L2}$ within the matching circuit 98B such that a phase of the load impedance measurement value MZ is zero (0) and an absolute value thereof is 50Ω, i.e., such that the load impedance measurement value MZ is equal to or approximate to the matching point $Z_s$. In this case, the arithmetic average value $aZ_{on}$ of the load impedance Z during the pulse-on period $T_{on}$ or the moving average value $cZ_{on}$ thereof always becomes the matching target point.

<Configuration of Major Components Within Power Supply Control Unit>

Figure 7:
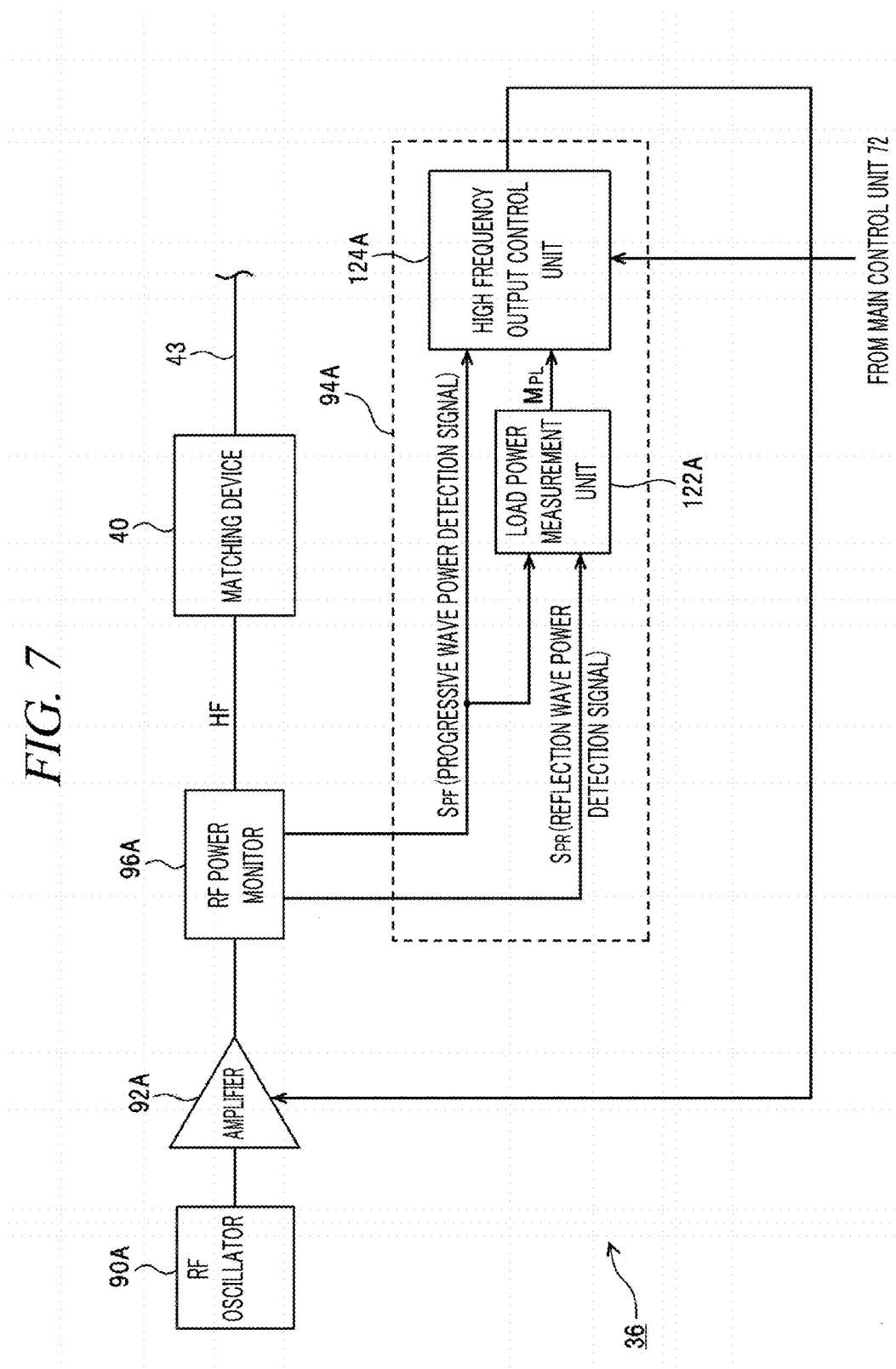
FIG. 7 is a block diagram showing a configuration within a high frequency output control unit of FIG. 3.
Figure 8:
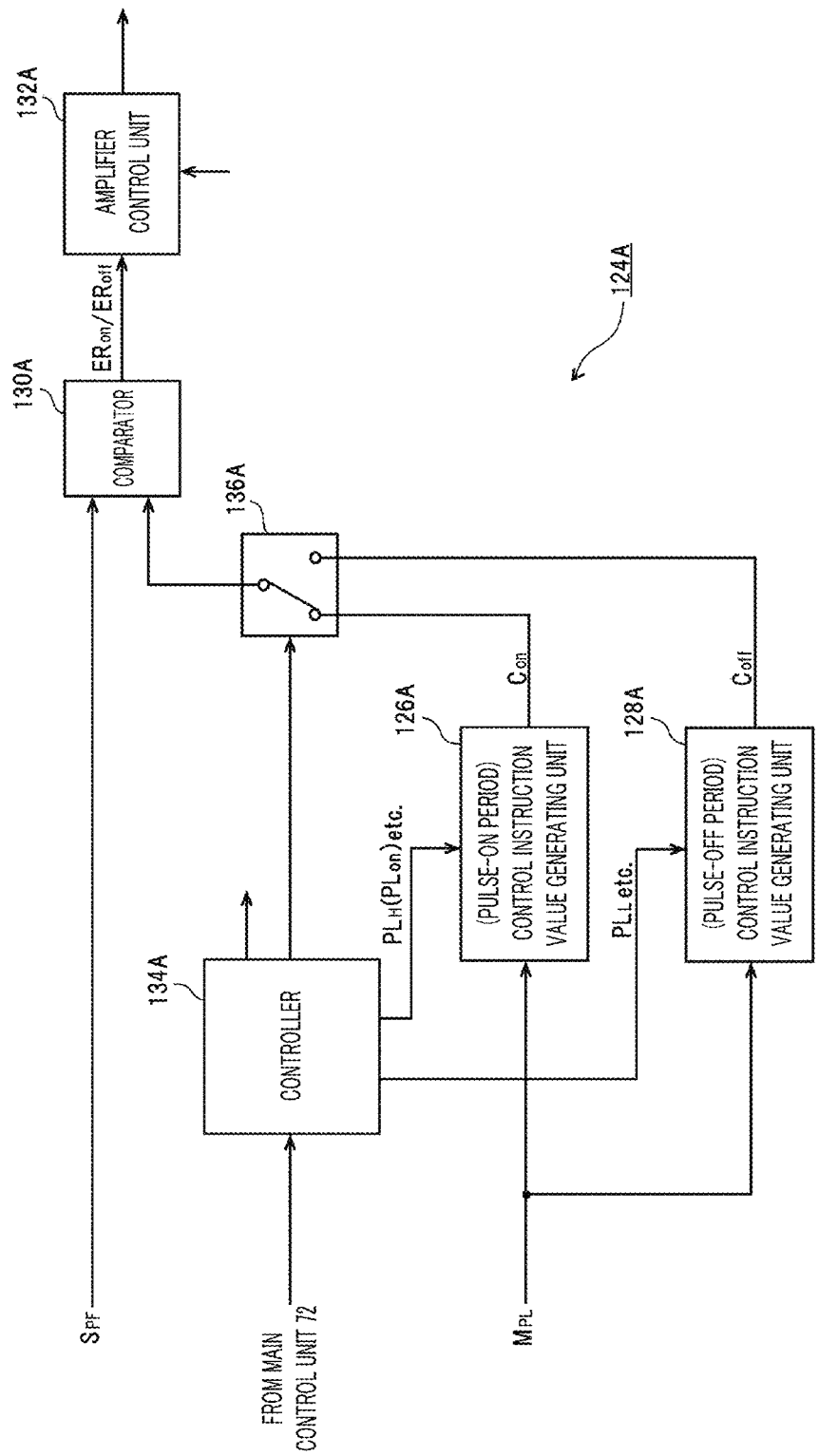
FIG. 8 is a block diagram illustrating configurations of a RF power monitor and a power supply control unit of FIG. 7.

FIG. 7 and FIG. 8 illustrate a configuration of major components within the power supply control unit 94A of the high frequency power supply 36 of the plasma generation system.

The power supply control unit 94A includes, as depicted in FIG. 7, a load power measurement unit 122A and a high frequency output control unit 124A. The load power measurement unit 122A calculates a measurement value $M_{PL}$ ($M_{PL}=S_{PF}-S_{PR}$) of the load power PL inputted to the load (mainly, plasma) from a progressive wave power detection signal $S_{PF}$ and a reflection wave power detection signal $S_{PR}$ obtained from the RF power monitor 96A.

The load power measurement unit 122A may implemented by an analog arithmetic circuit or a digital arithmetic circuit. That is, the load power measurement value $M_{PL}$ of an analog signal may be obtained by calculating a difference between an analog progressive wave power detection signal $S_{PF}$ and an analog reflection wave power detection signal $S_{PR}$, or the load power measurement value $M_{PL}$ of a digital signal may be obtained by converting the progressive wave power detection signal $S_{PF}$ and the reflection wave power detection signal $S_{PR}$ into digital signals and then calculating a difference therebetween.

The high frequency output control unit 124A includes, as shown in FIG. 8, a first control instruction value generating unit 126A for the pulse-on period (first period); a second control instruction value generating unit 128A for the pulse-off period (second period); a comparator 130A configured to obtain a comparative error $ER_{on}$ or $ER_{off}$ by comparing the progressive wave power detection signal $S_{PF}$ from the RF power monitor 96A with a first control instruction value $C_{on}$ from the first control instruction value generating unit 126A or a second control instruction value $C_{off}$ from the second control instruction value generation unit 128A, respectively; an amplifier control unit 132A configured to adjust a gain or an amplification factor of the power amplifier 92 based on the comparative error $ER_{on}$ or $ER_{off}$; and a controller 134A configured to control respective components within the high frequency output control unit 124A.

Here, the first control instruction value generating unit 126A receives the load power measurement value $M_{PS}$ from the load power measurement unit 122A and the load power set value $PL_H$ (or $PL_{on}$) from the main control unit 72 via the controller 134A, and generates the first control instruction value $C_{on}$ for a feedback control to be performed on the progressive wave power PF during the pulse-on period $T_{on}$ in each cycle of the modulation pulse MS.

Meanwhile, the second control instruction value generating unit 128A receives the load power measurement value $M_{PL}$ from the load power measurement unit 122A and the load power set value $PL_L$ from the controller 134A, and generates the second control instruction value $C_{off}$ for a feedback control to be performed on the progressive wave power PF during the pulse-off period $T_{off}$ in each cycle of the modulation pulse MS.

Desirably, the first and second control instruction value generating units 126A and 128A maybe be implemented by digital circuits. In such a case, the first and second control instruction values $C_{on}$ and $C_{off}$ can be outputted in the form of analog signals by providing a digital-analog (D/A) converter at an output end of each unit.

The first control instruction value $C_{on}$ outputted from the first control instruction value generating unit 126A and the second control instruction value $C_{off}$ outputted from the second control instruction value generating unit 128A are alternately sent to the comparator 130A via the a switching circuit 136A. In each cycle of the modulation pulse MS, the switching circuit 136A is operated under the control of the controller 134A, and is configured to select and send the first control instruction value $C_{on}$ from the first control instruction value generating unit 126A to the comparator 130A during the pulse-on period $T_{on}$ and to select and send the second control instruction value $C_{off}$ from the second control instruction value generating unit 128A to the comparator 130A during the pulse-off period $T_{off}$.

Accordingly, in each cycle of the modulation pulse MS, during the pulse-on period $T_{on}$, the comparator 130A compares the progressive wave power detection signal $S_{PF}$ with the first control instruction value $C_{on}$ and generates a comparative error, i.e., the first comparative error $ER_{on}$, ($ER_{on}=C_{on}-S_{PF}$). During the pulse-off period $T_{off}$ on the other hand, the comparator 130A compares the progressive wave power detection signal $S_{PF}$ with the second control instruction value $C_{off}$ and generates a comparative error, i.e., the second comparative error $ER_{off}$ ($ER_{off}=C_{off}-S_{PF}$).

The amplifier control unit 132A is operated under the control of the controller 134A. In each cycle of the modulation pulse MS, the amplifier controller unit 132A controls the output of the high frequency power supply 36 by adjusting the gain or the amplification factor of the power amplifier 92A such that the first comparative error $ER_{on}$ is approximate to zero (0) during the pulse-on period $T_{on}$, and also controls the output of the high frequency power supply 36 by adjusting the gain or the amplification factor of the power amplifier 92A such that the second comparative error $ER_{off}$ is approximate to zero (0) during the pulse-off period $T_{off}$.

Furthermore, a linear amplifier may be appropriately used as the power amplifier 92A. In addition, the comparator 130A may be implemented by, for example, a differential amplifier. In the comparator 130A, a preset proportional relationship is established between the difference ($C_{on}-S_{PF}$ or $C_{off}-S_{PF}$) of the input signal and the comparative error $ER_{on}$ or $ER_{off}$ of the output signal.

The high frequency power supply 38 of the ion attraction system also includes a load power measurement unit 122B and a high frequency output control unit 124B (both are not illustrated), which have the same configurations and the same operations as those of the above-described power supply control unit 94A of the high frequency power supply 36 of the plasma generation system, except that the frequency of the high frequency power LF is different from the frequency of the high frequency power HF of the plasma generation system.

<Operation of PL Control in Exemplary Embodiment>

In the plasma processing apparatus according to the present exemplary embodiment, both of the high frequency power supplies 36 and 38 are configured to perform the PL control for maintaining the net high frequency power inputted to the load (mainly, plasma), i.e., the load power PL at individual set values during the pulse-on period $T_{on}$ and the pulse-off period $T_{off}$ when the high frequency power HF for plasma generation or the high frequency power LF for ion attraction is being supplied into the chamber 10.

Hereinafter, in the case of performing the high/low pulse modulation on the high frequency power HF for plasma generation, an operation of the PL control according to the present exemplary embodiment will be described. Further, the on/off pulse modulation is performed on the high frequency power LH for ion attraction with the same modulation pulse MS.

In this case, the main control unit 72 sends a control signal and data of load power set values $PL_H$ and $PL_L$ required for the high/low pulse modulation to the power supply control unit 94A of the high frequency power supply 36 of the plasma generation system, and also sends thereto the modulation pulse MS as a timing signal for the pulse modulation. Herein, $PL_H$ is a first load power set value indicating the level (high level) of the high frequency power HF during the pulse-on period $T_{on}$, and $PL_L$ is a second load power set value indicating the level (low level) of the high frequency power HF during the pulse-off period $T_{off}$. The high frequency power supply 36 performs the PL control to be described below on the high frequency power HF which is outputted from this high frequency power supply 36 by the high/low pulse modulation.

The load power set values $PL_H$ and $PL_L$ from the main control unit 72 are set in the controller 134A within the high frequency output control unit 124A. The controller 134A sends the load power set values $PL_H$ and $PL_L$, and required control signals and clock signals to the first and second control instruction value generating units 126A and 128A.

In each cycle of the modulation pulse MS, the first control instruction value generating unit 126A receives the load power measurement values $M_{PL}$ from the load power measurement unit 122A during the pulse-on period $T_{on}$ and uses them as a feedback signal. Typically, an average value (desirably, a moving average value) of the load power measurement values $M_{PL}$ is used as the feedback signal, though an instantaneous value or a representative value of the load power measurement value $M_{PL}$ can also be used as the feedback signal.

To be specific, a moving average value $AM_{PL}$ of the load power measurement values $M_{PL}$, which are sent from the load power measurement unit 122A during the pulse-on period $T_{on}$, for multiple cycles of the modulation pulse MS is calculated. Then, a comparative error or a deviation therebetween is calculated by comparing the moving average value $AM_{PL}$ with the load power set value $PL_H$. Further, a target value of the feedback control to be performed on the progressive wave power PF during the pulse-on period $T_{on}$, i.e., a first control instruction value $C_{on}$ is determined such that the deviation approaches zero (0) at an appropriate speed in a next or subsequent cycle. In order to determine the first control instruction value $C_{on}$, a publicly-known algorithm commonly used as a technique for the feedback control or the feedforward control may be used.

Meanwhile, in each cycle of the modulation pulse MS, the second control instruction value generating unit 128A receives the load power measurement values $M_{PL}$ from the load power measurement unit 122A during the pulse-off period $T_{off}$ and uses them as a feedback signal. Typically, an average value (desirably, a moving average value) of the load power measurement values $M_{PL}$ is used as the feedback signal, though an instantaneous value or a representative value of the load power measurement values $M_{PL}$ can also be used as the feedback signal.

To elaborate, a moving average value $BM_{PL}$ of the load power measurement values $M_{PL}$, which are sent from the load power measurement unit 122A during the pulse-off period $T_{off}$, for a single cycle or multiple cycles is calculated. Then, a comparative error or a deviation is calculated by comparing the moving average value $BM_{PL}$ with the load power set value $PL_L$. Further, a target value of the feedback control to be performed on the progressive wave power PF during the pulse-off period $T_{off}$, i.e., the second control instruction value $C_{off}$ is determined such that the deviation approaches zero (0) at an appropriate speed in a next or subsequent cycle. In order to determine the second control instruction value $C_{off}$, a publicly-known algorithm commonly used as the technique of the feedback control or the feedforward control may be used.

As described above, in each cycle of the modulation pulse MS, during the pulse-on period $T_{on}$, the comparator 130A compares the progressive wave power detection signal $S_{PF}$ with the first control instruction value $C_{on}$ from the first control instruction value generating unit 126A and obtains the comparative error (first comparative error) $ER_{on}$. Meanwhile, during the pulse-off period $T_{off}$, the comparator 130A compares the progressive wave power detection signal $S_{PF}$ with the second control instruction value $C_{off}$ from the second control instruction value generating unit 128A and obtains the comparative error (second comparative error) $ER_{off}$. Further, in each cycle of the modulation pulse MS, the amplifier control unit 132A adjusts the gain or the amplification factor of the power amplifier 92A such that the first comparative error $ER_{on}$ is approximate to zero (0) during the pulse-on period $T_{on}$, and adjusts the gain or the amplification factor of the power amplifier 92A such that the second comparative error $ER_{off}$ is approximate to zero (0) during the pulse-off period $T_{off}$.

Thus, in the high frequency power supply 36 configured to output the high frequency power HF through the high/low pulse modulation, the feedback control is performed on the progressive wave power PF propagating on the high frequency transmission line 43 in the forward direction such that the load power measurement value $M_{PL}$ obtained from the RF power monitor 96A and the load power measurement unit 122A is equal to or approximate to the first load power set value $PL_H$ during the pulse-on period $T_{on}$, and equal to or approximate to the second load power set value $PL_L$ during the pulse-off period $T_{off}$. That is, the feedback controls are performed on the output of the high frequency power supply 36 during the pulse-on period $T_{on}$ and during the pulse-off period $T_{off}$, independent.

According to this dual feedback-control mechanism performed for the pulse-on period $T_{on}$ and the pulse-off period $T_{off}$ independently, it is possible to easily and accurately follow up a periodic change in the reflection wave power PR and the progressive wave power PF which changes in synchronization with the modulation pulse MS, and, also, it is possible to easily catch up with a rapid load change caused when the modulation pulse MS is inverted. Accordingly, even if the frequency of the modulation pulse MS is set to be high, the load power PL can be stably maintained at the load power set values $PL_H$ and $PL_L$ during the pulse-on period $T_{on}$ and during pulse-off period $T_{off}$, respectively.

Meanwhile, in the high frequency power supply 38 of the ion attraction system configured to perform the on/off pulse modulation on the high frequency power LF, a feedback control for PL control is performed on the progressive wave power PF only during the pulse-on period $T_{on}$ by the power supply control unit 94B in each cycle of the modulation pulse MS. The controller 134B within the power supply control unit 94B maintains the second control instruction value generating unit 128B for the pulse-off period in a complete rest or inactive state, and operates only the first control instruction value generating unit 126B for the pulse-on period. In this case, the load power set value $PL_{on}$ indicating the level (on-level) of the high frequency power HF during the pulse-on period $T_{on}$ is sent to the first control instruction value generating unit 126B.

In each cycle of the modulation pulse MS, during the pulse-on period $T_{on}$, a comparator 130B compares the progressive wave power detection signal $S_{PF}$ from the RF power monitor 96B with the first control instruction value $C_{on}$ from the first control instruction value generating unit 126B and generates a comparative error (first comparative error) $ER_{on}$. Meanwhile, during the pulse-off period $T_{off}$, the comparator 130B is not substantially operated. Further, in each cycle of the modulation pulse MS, during the pulse-on period $T_{on}$, an amplifier control unit 132B adjusts the gain or amplification factor of the power amplifier 92B such that the first comparative error $ER_{on}$ is approximate to zero (0), and, during the pulse-off period $T_{off}$, the amplifier control unit 132B is not substantially operated.

However, in the high frequency power supply 38 configured to perform the on/off pulse modulation, it is also possible to perform the PF control. In such a case, a progressive wave power set value $PF_s$ as a comparison reference value is sent to the comparator 130B from the controller 134B.

<Example of Etching Process>

The present inventors have conducted an experiment of a HARC (High Aspect Ratio Contact) process in which the high/low pulse modulation is performed in the plasma etching apparatus illustrated in FIG. 1, and have examined effects on various process characteristics when the length of the pulse-off period $T_{off}$, the high frequency power (load power) $PL_L$ during the pulse-off period $T_{off}$, or the upper DC voltage value during the pulse-off period $T_{off}$ is set as a parameter.

In this experiment, a semiconductor wafer W as a sample is prepared. This semiconductor wafer W is provided with a fine hole 140 which is formed, by a first etching process, partway through a surface layer portion of a multilayer structure (to a depth $d_1$ reaching a third $SiO_2$ layer 152), as illustrated in FIG. 9A. On this sample semiconductor wafer W, there is conducted an experiment in which a second etching process of deepening the fine hole 140 to a lower portion of the third $SiO_2$ layer 152 (i.e., to a depth d2), as illustrated in FIG. 9B, is performed. Here, in the second etching process, the high/low pulse modulation is performed on the high frequency power HF for plasma generation, the on/off pulse modulation is performed on the high frequency power LF for ion attraction, and a magnitude (absolute value) of the DC voltage (upper DC voltage) $V_{dc}$ applied to the upper electrode 46 is adjusted in synchronization with the modulation pulse MS. In FIG. 9A and FIG. 9B, a reference numeral 142 denotes an etching mask (photoresist); 144, a first $SiO_2$ layer; 146, a first SiN layer; 148, a second $SiO_2$ layer; 150, a second SiN layer; 152, the third $SiO_2$ layer; 154, a third SiN layer; and 156, a semiconductor substrate.

In this experiment, the process characteristics as evaluation targets are as follows: (1) an increment $d_2$-$d_1$ in the depth of the hole 140, i.e., an etched amount in the second etching process; (2) an increment in a necking (a necking CD) in the vicinity of a top of the hole 140; (3) an increment in a bowing (an intermediate $O_x$ bowing CD) in the second $SiO_2$ layer 148; (4) a selectivity (the increment $d_2$-$d_1$ in the depth of the hole 140/a decrement $d_m$ in a thickness of the mask); and (5) a variation amount in an aspect ratio (a ratio of the increment $d_2$-$d_1$ in the depth of the hole 14/the intermediate $O_x$ bowing CD).

To elaborate, the experiment regarding the second etching process includes a first experiment of comparing a dependency of the various process characteristics upon the pulse-off period; and a second experiment of comparing a dependency of the various process characteristics upon the upper DC voltage in both cases where the load power $PL_L$ of the high frequency power HF is set to 0 W and 200 W during the pulse-off period $T_{off}$, respectively. Further, setting the load power $PL_L$ of the high frequency power HF to 0 W during the pulse-off period $T_{off}$ in the high/low pulse modulation is the same as performing the on/off pulse modulation.

The main etching conditions commonly applied to the first experiment and the second experiment are as follows. An etching gas is $C_4F_6$/$NF_3$/Ar/$O_2$=76 sccm/10 sccm/75 sccm/73 sccm; a chamber pressure is 15 mTorr; a temperature of the lower electrode is 60° C.; the pulse-on period $T_{on}$ is 100 μs; the high frequency power LF for ion attraction during the pulse-on period $T_{on}$ is 10000 W; the high frequency power HF for plasma generation during the pulse-on period $T_{on}$ is 1000 W; and an absolute value $|V_{dc}|$ of the upper DC voltage $V_{dc}$ during the pulse-on period $T_{on}$ is 500 V.

<Parameters and Result of First Experiment>

In the first experiment of comparing the pulse-off period dependency of the various process characteristics, the absolute value $|V_{dc}|$ of the upper DC voltage $V_{dc}$ during the pulse-off period $T_{off}$ is fixed to 900 V, and by using the pulse-off period $T_{off}$ (frequency $f_s$ and duty ratio $D_s$ of the modulation pulse MS) as a parameter, five values of $T_{off}$, i.e., $T_{off}$=25 μs ($f_s$=8 kHz, $D_s$=80%), $T_{off}$=100 μs ($f_s$=5 kHz, $D_s$=50%), $T_{off}$=150 µs ($f_s$=4 kHz, $D_s$=40%), $T_{off}$=233 µs ($f_s$=3 kHz, $D_s$=30%), and $T_{off}$=400 µs ($f_s$=2 kHz, $D_s$=20%) are selected.

Figure 10A:
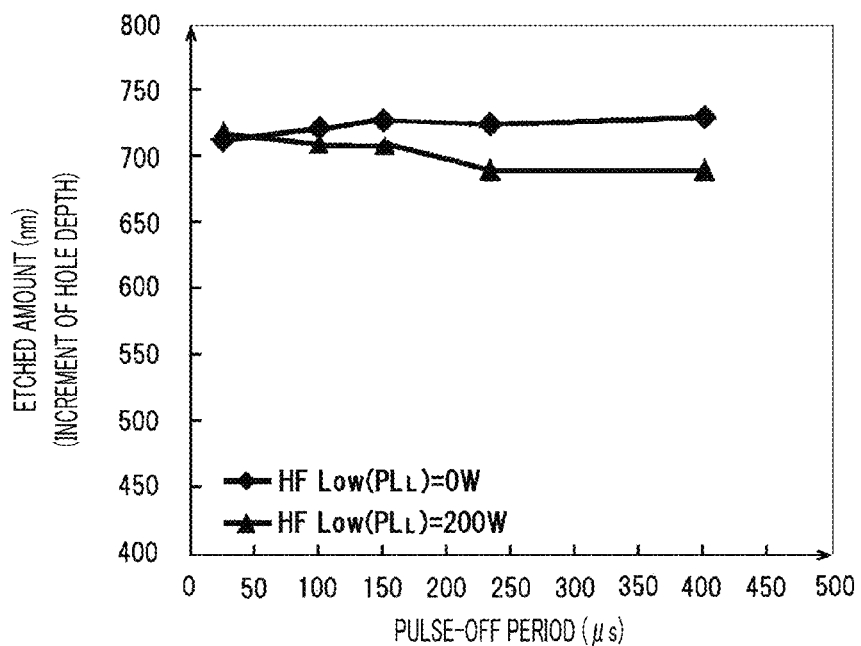
FIG. 10A presents a graph showing a dependency of one process characteristic (etching amount) on a pulse-off period, obtained from a first experiment of the exemplary embodiment.

FIG. 10A to FIG. 10E are graphs showing the result of the first experiment. As shown in FIG. 10A, (1) the increment in the depth of the hole 140 (i.e., the etched amount: $d_2$-$d_1$) is included in a range from about 700 nm to about 750 nm during the pulse-off period $T_{off}$ in a range from 25 µs to 400 µs in any of the cases where the load power $PL_L$ of the high frequency power HF are set to be 0 W and 200 W, and there is no great difference. As such, if the high/low pulse modulation is performed with $PL_L$=200 W, the etched amount or the etching rate equivalent to that in case of performing the on/off pulse modulation is obtained.

Figure 10B:
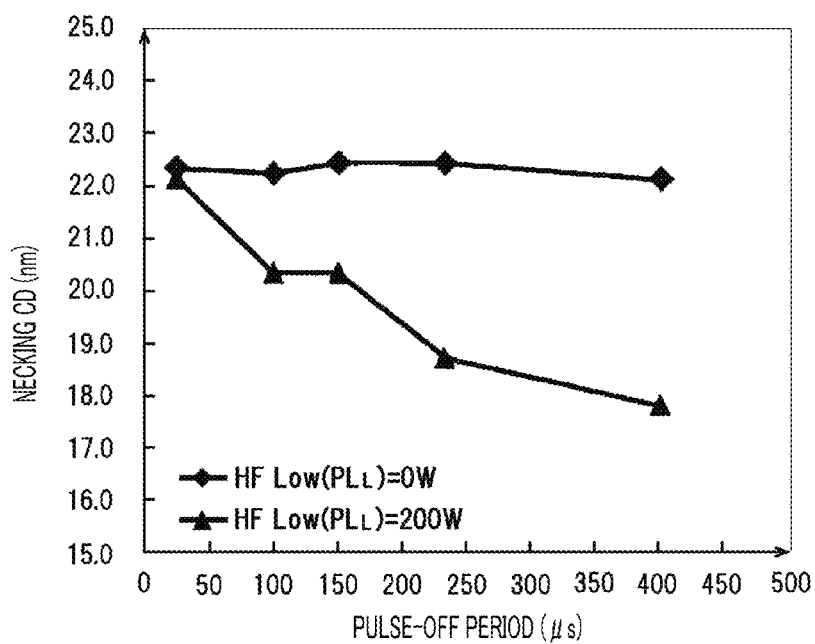
FIG. 10B provides a graph showing a dependency of one process characteristic (necking CD) on the pulse-off period, obtained from the first experiment.

As illustrated in FIG. 10B, if the pulse-off period $T_{off}$ is increased from 25 µs to 400 µs, (2) the necking CD stays within a range from about 22.0 to about 23.0 when the load power $PL_L$ of the high frequency power HF is 0 W, but greatly decreases from about 22.0 nm to about 18.0 nm or less when the load power $PL_L$ of the high frequency power HF is 200 W. As such, if the high/low pulse modulation is performed with $PL_L$=200 W (particularly, if $f_s$ is 3 kHz or less and $T_{off}$ is 233 µs or more), the necking CD is greatly improved as compared to the case of performing the on/off pulse modulation.

Figure 10C:
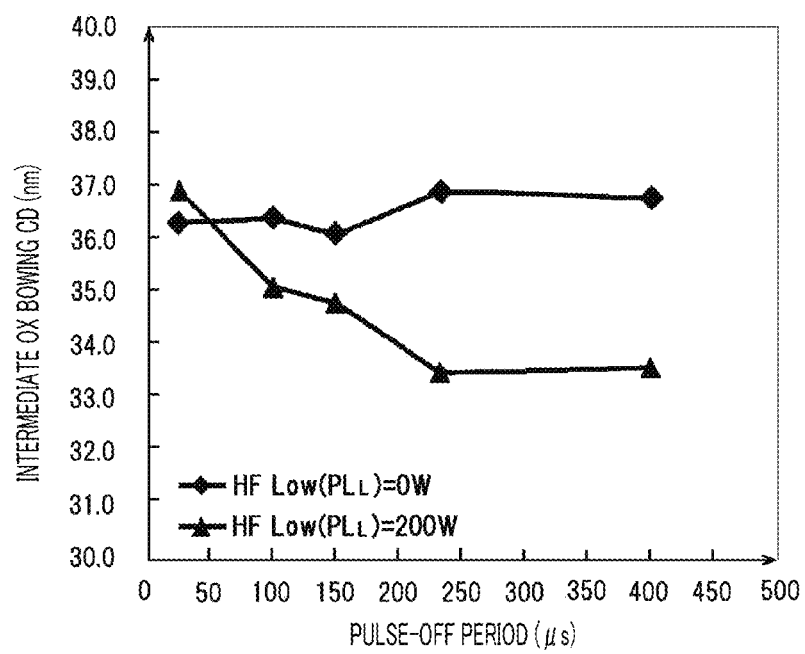
FIG. 10C depicts a graph showing a dependency of one process characteristic (intermediate $O_x$ bowing CD) on the pulse-off period, obtained from the first experiment.

As illustrated in FIG. 10C, if the pulse-off period $T_{off}$ is increased from 25 µs to 400 µs, (3) the intermediate $O_x$ bowing CD stays within a range of from about 36.0 to about 37.0 when the load power $PL_L$ of the high frequency power HF is 0 W, but greatly decreases from about 37.0 nm to about 34.0 nm when the load power $PL_L$ of the high frequency power HF is 200 W (but hardly decreased when $T_{off}$ is 233 µs or more). As such, if the high/low pulse modulation is performed with $PL_L$=200 W (particularly if $f_s$ is 3 kHz or less and $T_{off}$ is 233 µs or more), the intermediate $O_x$ bowing CD is also greatly improved as compared to the case of performing the on/off pulse modulation.

Figure 10D:
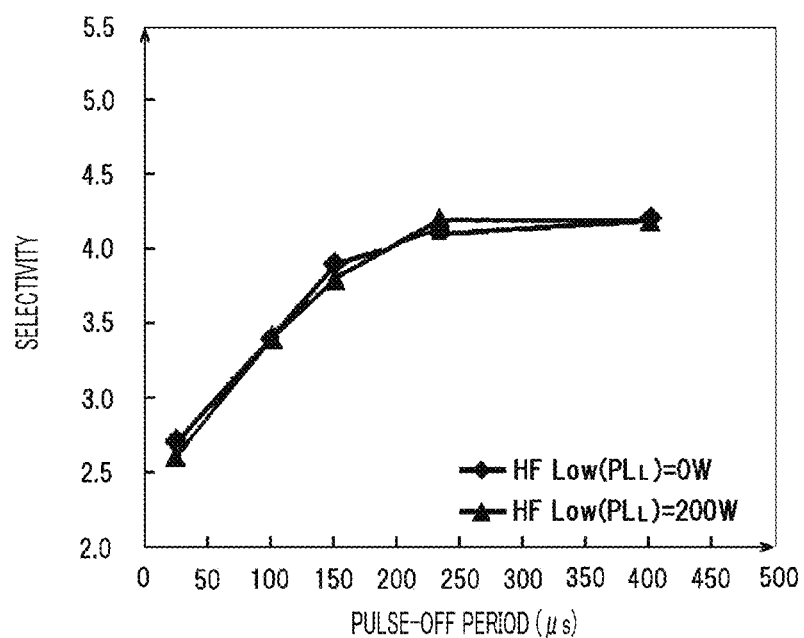
FIG. 10D offers a graph showing a dependency of one process characteristic (selectivity) on the pulse-off period, obtained from the first experiment.

As illustrated in FIG. 10D, if the pulse-off period $T_{off}$ is increased from 25 µs to 233 µs, (4) the selectivity increases from about 2.5 to about 4.2 at an approximately same rate in any cases where the load power $PL_L$ of the high frequency power HF are set to be 0 W and 200 W, respectively, and saturated when $T_{off}$ is more than 233 µs. As such, if the high/low pulse modulation is performed with $PL_L$=200 W, the selectivity is improved to the same extent as that in case of performing the on/off pulse modulation.

Figure 10E:
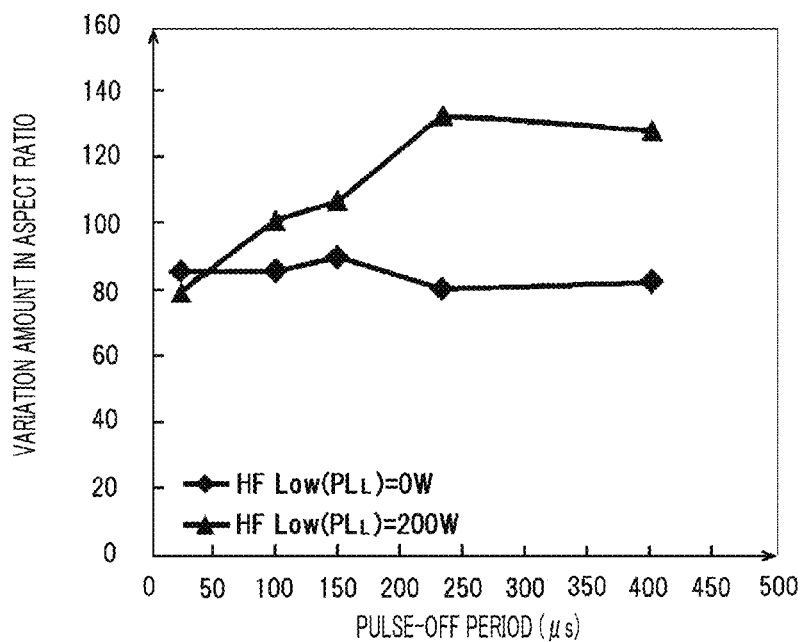
FIG. 10E is a graph showing a dependency of one process characteristic (variation amount in aspect ratio) on the pulse-off period, obtained from the first experiment.

As illustrated in FIG. 10E, if the pulse-off period $T_{off}$ is increased from 25 µs to 400 µs, (5) the variation amount in the aspect ratio just stays within a range from about 80 to about 85 when the load power $PL_L$ of the high frequency power HF is 0 W, but greatly increases from about 80 to about 130 when the load power $PL_L$ of the high frequency power HF is 200 W (but saturated when $T_{off}$ is more than 233 µs). As such, if the high/low pulse modulation is performed with $PL_L$=200 W (particularly if $f_s$ is 3 kHz or less and $T_{off}$ is 233 µs or more), the variation amount in the aspect ratio is greatly improved as compared to the case of performing the on/off pulse modulation.

<Parameters and Result of Second Experiment>

In the second experiment of comparing the dependency of the various process characteristics upon the upper DC voltage, the pulse-off period $T_{off}$ (frequency $f_s$ and duty ratio $D_s$ of the modulation pulse MS) is fixed to 233 µs ($f_s$=3 kHz, $D_s$=30%), and by using the absolute value $|V_{dc}|$ of the upper DC voltage $V_{dc}$ during the pulse-off period $T_{off}$ as a parameter, three values of $|V_{dc}|$, i.e., $|V_{dc}|$=500 V, 900 V, and 1200 V, are selected.

Figure 11A:
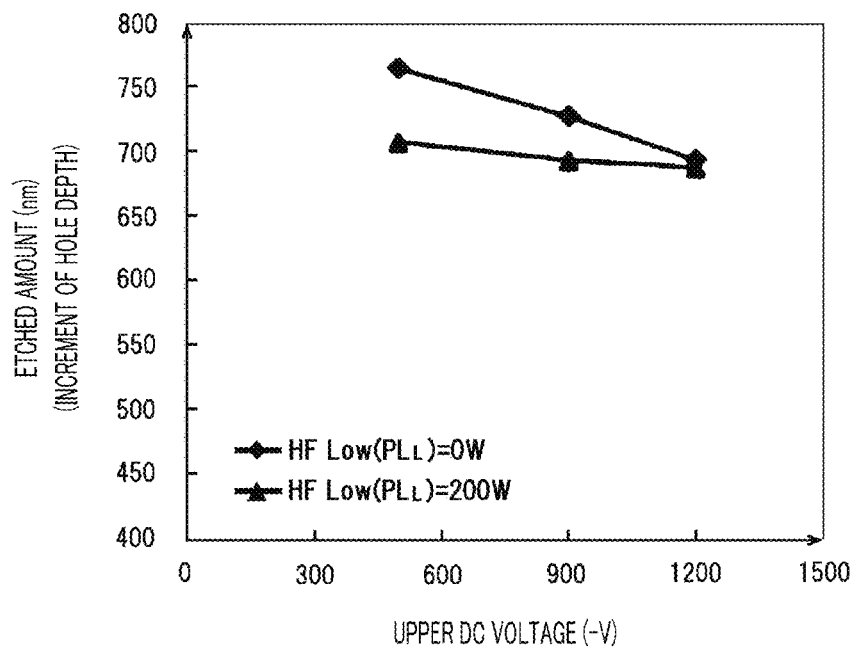
FIG. 11A presents a graph showing a dependency of one process characteristic (etching amount) on an upper DC voltage, obtained from a second experiment of the exemplary embodiment.

FIG. 11A to FIG. 11E are graphs showing the result of the second experiment. As shown in FIG. 11A, if the absolute value $|V_{dc}|$ of the upper DC voltage $V_{dc}$ during the pulse-off period $T_{off}$ is increased to 500 V, 900 V, and 1200 V, (1) the increment in the depth of the hole 140 (etched amount: $d_2$-$d_1$) linearly decreases from about 760 nm to about 680 nm when the load power $PL_L$ of the high frequency power HF is 0 W, and gradually decreases from about 700 nm to about 680 nm when the load power $PL_L$ of the high frequency power HF is 200 W. As such, if the high/low pulse modulation is performed with $PL_L$=200 W, even when the absolute value $|V_{dc}|$ of the upper DC voltage $V_{dc}$ during the pulse-off period $T_{off}$ is increased, the increment in the depth of the hole 140 (etched amount) is not increased but tends to be decreased, but not lower than that in case of performing the on/off pulse modulation.

Figure 11B:
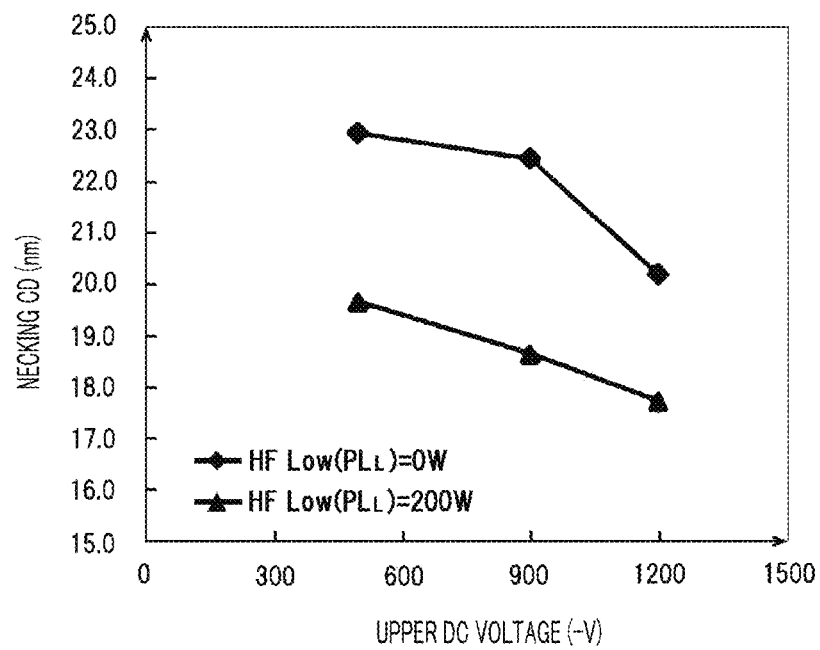
FIG. 11B provides a graph showing a dependency of one process characteristic (necking CD) on the upper DC voltage, obtained from the second experiment.

As illustrated in FIG. 11B, if the absolute value $|V_{dc}|$ of the upper DC voltage $V_{dc}$ during the pulse-off period $T_{off}$ is increased to 500 V, 900 V, and 1200 V, (2) the necking CD decreases from about 23.0 nm to about 20.0 nm when the load power $PL_L$ of the high frequency power HF is 0 W, but more gradually decreases at a lower level from about 19.6 nm to about 17.8 nm when the load power $PL_L$ of the high frequency power HF is 200 W. As such, if the high/low pulse modulation is performed with $PL_L$=200 W, as the absolute value $|V_{dc}|$ of the upper DC voltage $V_{dc}$ during the pulse-off period $T_{off}$ is increased, the necking CD is also improved. Here, the necking CD is improved higher than that in case of performing the on/off pulse modulation.

Figure 11C:
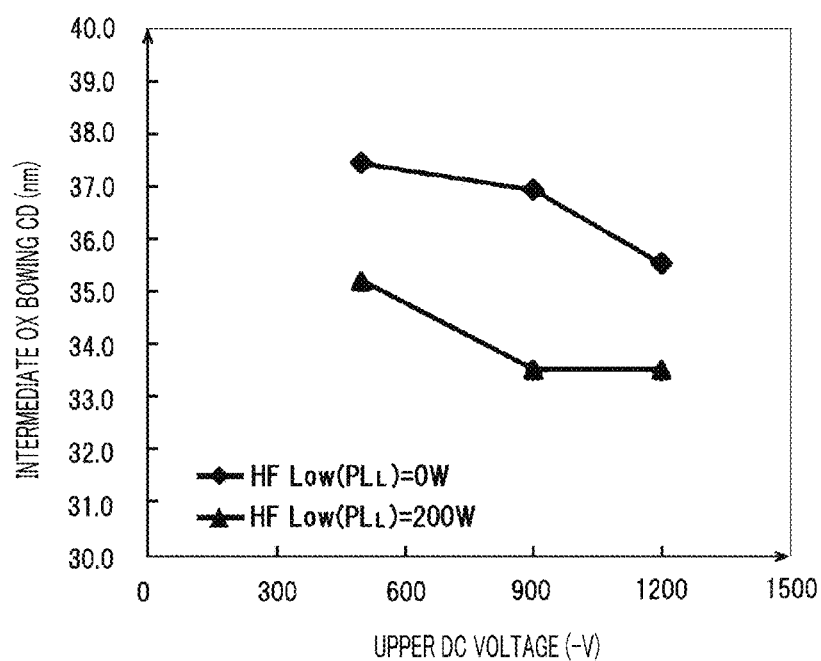
FIG. 11C depicts a graph showing a dependency of one process characteristic (intermediate $O_x$ bowing CD) on the upper DC voltage, obtained from the second experiment.

As illustrated in FIG. 11C, if the absolute value $|V_{dc}|$ of the upper DC voltage $V_{dc}$ during the pulse-off period $T_{off}$ is increased to 500 V, 900 V, and 1200 V, (3) the intermediate $O_x$ bowing CD decreases from about 37.5 nm to about 35.5 nm when the load power $PL_L$ of the high frequency power HF is 0 W, but more gradually decreases at a lower level from about 35.2 nm to about 33.5 nm when the load power $PL_L$ of the high frequency power HF is 200 W (but hardly decreases when $|V_{dc}|$ is 900 V or higher). As such, if the high/low pulse modulation is performed with $PL_L$=200 W, as the absolute value $|V_{dc}|$ of the upper DC voltage $V_{dc}$ during the pulse-off period $T_{off}$ is increased, the intermediate $O_x$ bowing CD is generally improved. The intermediate $O_x$ bowing CD is improved higher than that in case of performing the on/off pulse modulation.

Figure 11D:
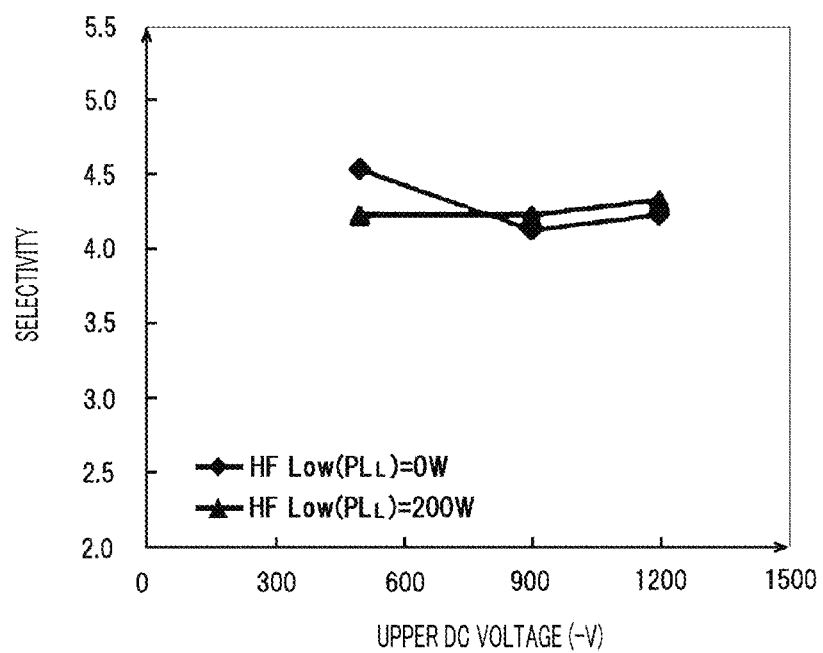
FIG. 11D offers a graph showing a dependency of one process characteristic (selectivity) on the upper DC voltage, obtained from the second experiment.

As illustrated in FIG. 11D, even if the absolute value $|V_{dc}|$ of the upper DC voltage $V_{dc}$ during the pulse-off period $T_{off}$ is varied in a range of from 500 V to 1200 V, (4) the selectivity is included within a range from about 4.1 to about 4.5 in both cases where the load power $PL_L$ of the high frequency power HF is set to be 0 W and 200 W, respectively. As such, if the high/low pulse modulation is performed with $PL_L$=200 W, the selectivity is improved to the same extent as that in case of performing the on/off pulse modulation.

Figure 11E:
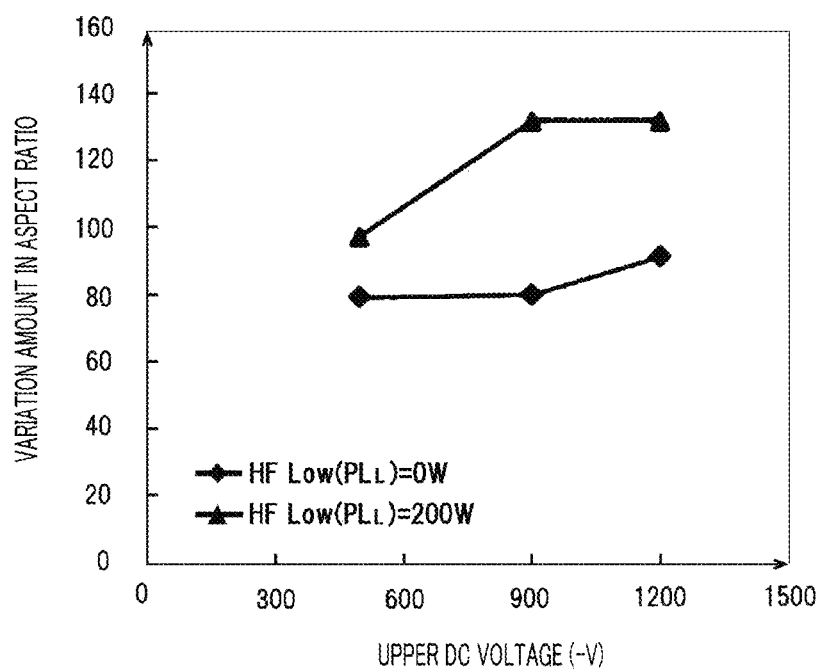
FIG. 11E is a graph showing a dependency of one process characteristic (variation amount in aspect ratio) on the upper DC voltage, obtained from the second experiment.

As illustrated in FIG. 11E, if the absolute value $|V_{dc}|$ of the upper DC voltage $V_{dc}$ during the pulse-off period $T_{off}$ is increased to 500 V, 900 V, and 1200 V, (5) the variation amount in the aspect ratio increases from about 80 to about 92 when the load power $PL_L$ of the high frequency power HF is 0 W and the absolute value $|V_{dc}|$ is 900 V or higher, but further increases at a higher level from about 99 to about 132 when the load power $PL_L$ of the high frequency power HF is 200 W (but saturated when $|V_{dc}|$ is 900 V or higher). As such, if the high/low pulse modulation is performed with $PL_L$=200 W, the variation amount performed in the aspect ratio is greatly improved, as compared to that in case of performing the on/off pulse modulation.

<Evaluation of Experiments>

As can be seen from the above experiments, in the HARC (High Aspect Ratio Contact) process as illustrated in FIG. 9, the superior process characteristics can be obtained by performing the high/low pulse modulation on the high frequency power HF for plasma generation, as compared to the case of performing the on/off pulse modulation thereon. Particularly, as compared to the case of performing the on/off pulse modulation thereon bowing can be suppressed while as compared to the case of performing the on/off pulse modulation thereon high selectivity can be achieved. This will be taken into further consideration.

In pulse modulation, if a pulse-on period is switched to a pulse-off period in each cycle of a modulation pulse, an effect of attracting ions is weakened, and a plasma reaction product is deposited on a mask. Thus, a low-frequency pulse/a low duty ratio (long pulse-off period) may be suitable for improving a selectivity between a mask and an etching target material or a target film. Since, however, the pulse-off period less contributes to the etching, if the pulse-off period is increased more than necessary, the time required for the overall plasma process is increased, so that the productivity is reduced.

Further, if an aspect ratio in a hole etching such as HARC is increased, an etching time period is increased. Therefore, in case of performing the on/off pulse modulation, even if the selectivity against the mask is obtained, the bowing is highly likely to occur since ions are incident into a sidewall of the hole for a long time. Therefore, it is difficult to obtain a favorable final processing shape.

Immediately after the pulse-on period is switched to the pulse-off period, decrements of electrons, ions, and radicals in the processing space within the chamber are all different. The electrons and ions are extinguished in relatively short times of about 10 µs and about 100 µs, respectively, whereas the radicals remain even after a lapse of about 1 ms. It is deemed that the radicals left during this off-time react with a surface layer of the mask to form a mask surface protective film.

In the high/low pulse modulation, by applying the high frequency power HF for plasma generation, a processing gas is excited and ions and radicals are generated even during the pulse-off period. In this case, the high frequency power HF for plasma generation applies low acceleration energy to the ions, as compared to the high frequency power LF for ion attraction, and, thus, makes a minor contribution to the etching. Meanwhile, a considerable amount of radicals are generated, and in case of applying dual high frequency powers to a lower electrode, the HF power is low by turning off the LF. Therefore, the ions can be attracted to a bottom portion of the hole by introducing the radicals into the bottom portion with an appropriate RF bias. As a result, deposition of a reaction product on the sidewall of the hole is accelerated, and, thus, a sidewall protective film, which is effective in suppressing the bowing, can be formed.

Further, as described above, it is also found out that when performing the high/low pulse modulation, a technique of setting an absolute value of the upper DC voltage to be one level higher during the pulse-off period than that during the pulse-on period in synchronization with the modulation pulse is effective in improving various process characteristics, particularly the necking, the intermediate bowing CD, and the vertical shape.

That is, it is deemed that by raising the absolute value of the upper DC voltage one level up during the pulse-off period, a certain action occurs (for example, energy of electrons incident into the etching target material and the mask is increased), thus enabling to obtain an effect of extending the sidewall protective film toward a bottom portion within the hole or an effect of suppressing a cut-off of a shoulder portion of the mask (thus reducing a ratio of incidence of ions travelling in the incline direction that causes the bowing).

In the HARC process, when performing the high/low pulse modulation on the high frequency power for plasma generation, it is desirable to set a frequency of the modulation pulse to be in a range of 1 kHz or higher (desirably, in a range from 2 kHz to 8 kHz, and, more desirably, in a range from 2 kHz to 3 kHz), and, also, to set the load power $PL_L$ of the high frequency power HF for plasma generation during the pulse-off period to be in an appropriately higher range (for example, 100 W or higher, and, desirably, 200 W or higher).

In the plasma etching apparatus according to the present exemplary embodiment, a matching device 40 of the plasma generation system is operated such that a impedance sensor 106A having the above-described configuration and function measures the impedance of the plasma load with respect to the high frequency power supply 36 on the high frequency transmission line 43, calculates the weighted average value by weighted-averaging the load impedance measurement value during the pulse-on period $T_{on}$ and the load impedance measurement value during the pulse-off period $T_{off}$ with a required weighted factor, and matches this weighted average value with the output impedance of the high frequency power supply 36. In this case, by adjusting the weighted variable K for the weighted-averaging, it is possible to adjust a balance between the reflection wave power $PR_H$ during the pulse-on period $T_{on}$ and the reflection wave power $PR_L$ during the pulse-off period $T_{off}$. Therefore, the reflection wave power $PR_L$ during the pulse-off period $T_{off}$ can be reduced and, accordingly, the load power $PL_L$ can be preset to be a higher value.

Figure 12:
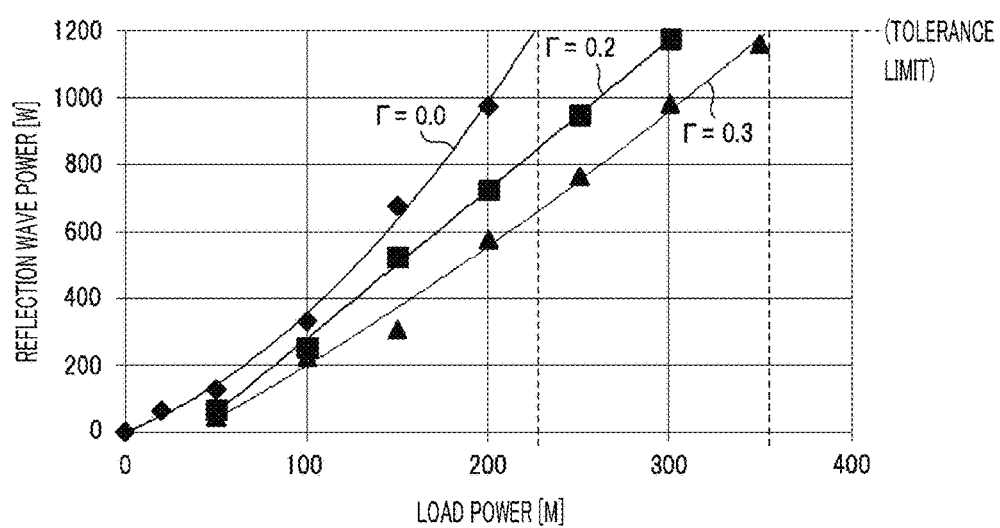
FIG. 12 depicts a graph showing a relationship between a reflection wave power and a load power that can be set in the high frequency power supply.

By way of example, in an actual high frequency power supply (having a tolerance limit of 1200 W for the reflection wave power) used as the high frequency power supply 36 of the plasma generation system, as shown in FIG. 12, by performing a matching method with a reflection coefficient $\Gamma$ of 0.2 or 0.3 during the pulse-on period $T_{on}$ according to the exemplary embodiment, it is possible to greatly increase the range of the load power $PL_L$ during the pulse-off period $T_{off}$ from about 230 W ($\Gamma$=0.0) to about 300 W ($\Gamma$=0.2) or to about 350 W ($\Gamma$=0.3), as compared to the case of performing the conventional matching method (a method of achieving substantially complete matching during the pulse-on period $T_{on}$) with a reflection coefficient $\Gamma$ of 0.0. From another viewpoint, this means that the high frequency power supply 36 can be downsized. Further, the reflection coefficient $\Gamma$ is given as $\Gamma=(PR_H/PF_H)^{1/2}$.

<Example Regarding Solution Against Upper Electrode Electric Discharge>

Generally, in the hole etching process such as a HARC process, if an aspect ratio is high, positive ions are easily accumulated in the bottom portion of the hole and ions may not straightly travel within the hole, so that it becomes difficult to obtain a favorable etching profile. In this regard, the plasma etching apparatus illustrated in FIG. 1 includes the DC power supply unit 62 and applies the negative DC voltage to the upper electrode 46. As a result, electrons emitted from the upper electrode 46 into the plasma generation space PA are accelerated toward the semiconductor wafer (processing target object) W on the susceptor (lower electrode) 16 and the electrons accelerated at a high speed reach a deep portion of the hole. Therefore, the positive ions accumulated in the bottom portion of the hole can be electrically neutralized. As a result, it is possible avoid the above-described problem that the ions may not straightly move within the hole.

However, if the negative DC voltage is applied to the upper electrode 46, discharge of a gas (abnormal discharge) may occur within the upper electrode 46, particularly within the gas discharge holes 48a or the gas holes 50a, so that the upper electrode 46 may be damaged. Such an abnormal discharge within the upper electrode may frequently occur when performing the on/off pulse modulation on both of the high frequency power HF for plasma generation and the high frequency power LF for ion attraction.

Figure 13:
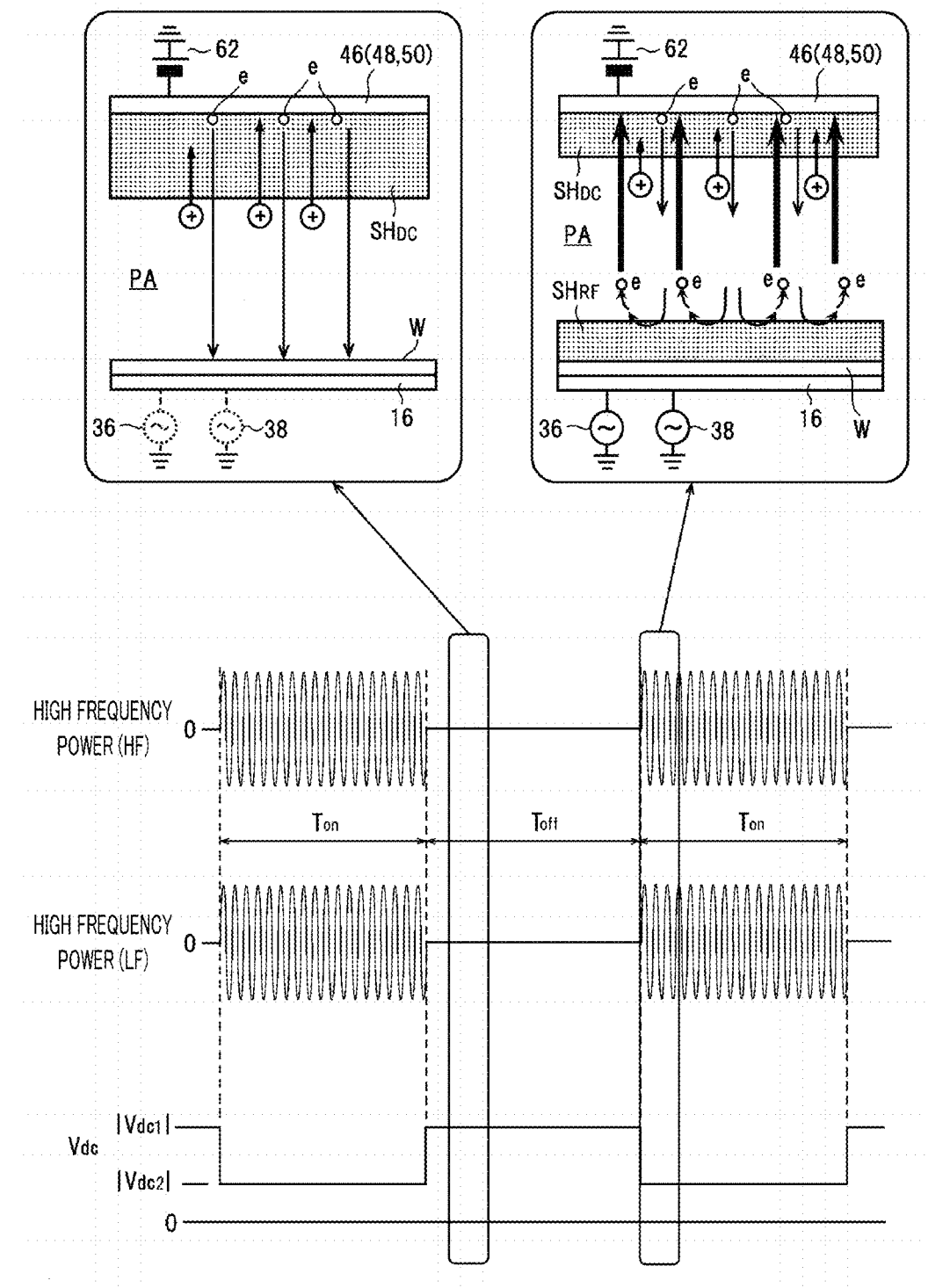
FIG. 13 is a diagram for describing an operation in which an abnormal discharge within an upper electrode occurs when performing an on/off pulse modulation on both the high frequency power for plasma generation and a high frequency power for ion attraction.

In this case, as illustrated in FIG. 13, during the pulse-off period $T_{off}$, both of the high frequency power supply 38 for ion attraction system and the high frequency power supply 36 for plasma generation system are turned off, and a negative DC voltage $V_{dc1}$ having a large absolute value is applied to the upper electrode 46 from the DC power supply unit 62. Accordingly, a high electric field region (hereinafter, referred to as "DC sheath") $SH_{DC}$, in which electrons (e) are accelerated in a direction of pushing the electrons and ions (+) are accelerated in a direction of pulling the ions, is formed near a surface of the upper electrode 46. Further, the electrons (e) accelerated by the DC sheath $SH_{DC}$ reach the semiconductor wafer W on the susceptor 16 to neutralize the positive ions in the bottom portion of the hole. At this time, since the plasma is extinguished within the plasma generation space PA, a plasma sheath (ion sheath) $SH_{RF}$ is hardly formed on a surface of the semiconductor wafer W. This state is continued throughout the pulse-off period $T_{off}$.

Further, when the pulse-off period $T_{off}$ is switched to the pulse-on period $T_{on}$, both of the high frequency power supplies 36 and 38 are turned on at the same time, and the high frequency powers HF and LF are applied to the susceptor 16. Accordingly, plasma of the processing gas is generated within the plasma generation space PA, and the plasma sheath $SH_{RF}$ is formed to cover the surface of the semiconductor wafer W within the chamber 10. In this case, the plasma sheath $SH_{RF}$ suddenly appears from an actually non-existent (zero) state and rapidly grows toward the upper electrode 46 (a thickness of the sheath increases). A growth rate of the plasma sheath $SH_{RF}$ mainly depends on a starting speed or a saturation value magnitude of a voltage (peak-to-peak value) $V_{pp}$ of the high frequency power LF for ion attraction which has a relatively low frequency.

Meanwhile, even when the absolute value of the DC voltage applied by the DC power supply unit 62 is changed from the relatively high value $|V_{dc1}|$ to a relatively low value $|V_{dc2}|$, the electrons (e) are constantly released from the upper electrode 46 and accelerated toward the semiconductor wafer W. However, unlike in the pulse-off period $T_{off}$, the plasma sheath $SH_{RF}$ on the semiconductor wafer W rapidly grows in the direction of increasing its thickness, i.e., increasing an electric field intensity. Thus, the electrons (e) accelerated from the upper electrode 46 are strongly bounced by the grown plasma sheath $SH_{RF}$. Further, the electrons (e) bounced by the plasma sheath $SH_{RF}$ may be dispersed toward the upper electrode 46 and introduced into the gas discharge holes 48a in the electrode plate 48 of the upper electrode 46 against the electric field of the DC sheath $SH_{DC}$, and may cause an electric discharge in the deep portion thereof.

In case that the abnormal discharge occurs within the upper electrode as mentioned above, a same force is applied to the electrons (e) from the electric field of the DC sheath $SH_{DC}$ at the side of the upper electrode 46 in both cases when accelerating the electrons (e) released from the upper electrode 46 toward the semiconductor wafer W and when decelerating the electrons (e) bounced by the plasma sheath $SH_{RF}$ at the side of the semiconductor wafer W. Therefore, the frequency or the speed by which the electrons are introduced into the gas discharge holes 48a in the upper electrode 46 hardly depends on the magnitude of the DC sheath $SH_{DC}$ but depends on the intensity of the plasma sheath $SH_{RF}$ for bouncing the electrons (e) toward the upper electrode 46, i.e., the growth rate of the plasma sheath $SH_{RF}$.

Further, the positive ions (+) generated in an upper portion of the plasma generation space PA may be attracted by the electric field of the DC sheath $SH_{DC}$ to collide with and sputter the surface of the upper electrode 46 (the electrode plate 48). However, the positive ions (+) do not cause the abnormal discharge within the upper electrode 46.

In the plasma etching apparatus depicted in FIG. 1, it is possible to effectively suppress the aforementioned abnormal discharge within the upper electrode 46 by switching the pulse modulation performed on the high frequency power HF for plasma generation from the on/off pulse modulation to the high/low pulse modulation.

Figure 14:
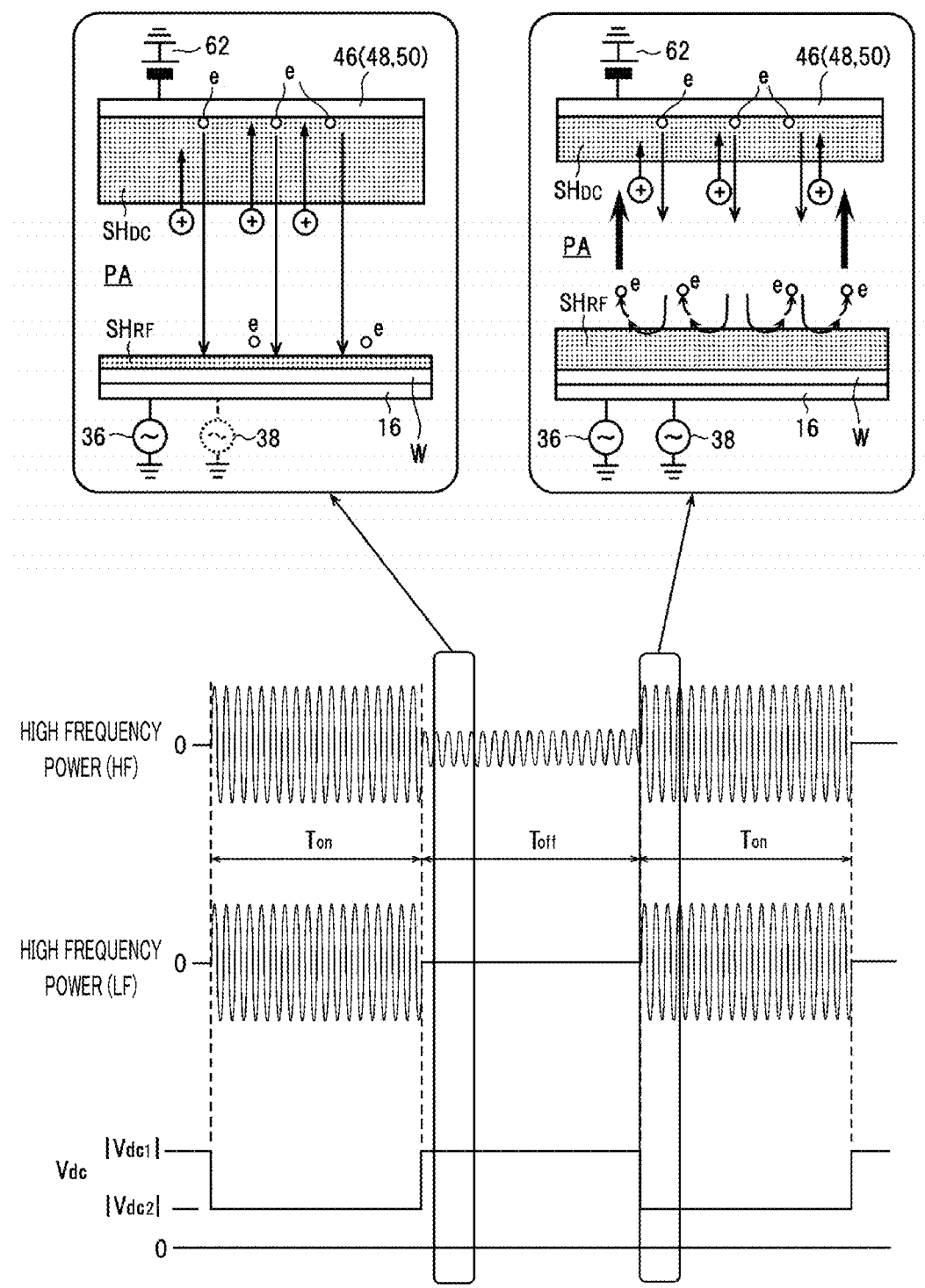
FIG. 14 is a diagram for describing an operation in which an abnormal discharge within the upper electrode does not occur when performing the high/low pulse modulation on the high frequency power for plasma generation and the on/off pulse modulation on the high frequency power for ion attraction.

In this case, as illustrated in FIG. 14, during the pulse-off period $T_{off}$, the high frequency power supply 36 is maintained in an on-state, and the high frequency power HF for plasma generation of a low-level power is applied to the susceptor 16. Thus, plasma does not extinguish in the plasma generation space PA but remains at a low density, so that the surface of the semiconductor wafer W is covered with a thin plasma sheath $SH_{RF}$. In this case, the electrons (e) accelerated at a high speed by the strong electric field of the DC sheath $SH_{DC}$ from the side of the upper electrode 46 are given an electric field or a force in a reverse direction by the plasma sheath $SH_{RF}$. However, since the plasma sheath $SH_{RF}$ is thin and the electric field in the reverse direction is weak, the electrons (e) pass through the plasma sheath $SH_{RF}$ to be incident toward the semiconductor wafer W. This state continues throughout the pulse-off period $T_{off}$.

If the pulse-off period $T_{off}$ is switched to the pulse-on period $T_{on}$, the high frequency power supply 38 is turned on to apply the high frequency power LF for ion attraction to the susceptor 16, and the high frequency power supply 36 applies the high frequency power HF of a higher level from the lower level. As a result, a density of the plasma generated within the plasma generation space PA is rapidly increased, and the thickness of the plasma sheath $SH_{RF}$ covering the surface of the semiconductor wafer W is further increased. In this case, however, the plasma sheath $SH_{RF}$ does not suddenly appear from the non-existent (zero) state, but increased just in its thickness while being existed. Therefore, the growth rate thereof is considerably slow, and a force for bouncing the electrons (e) accelerated at the high speed from the upper electrode 46 is not so great. For this reason, the electrons (e) bounced by the plasma sheath $SH_{RF}$ have a low initial speed for bouncing, and, thus, cannot pass through the DC sheath $SH_{DC}$ and do not enter the gas discharge holes 48a in the electrode plate 48 of the upper electrode 46. Therefore, the abnormal discharge within the upper electrode 46 does not occur.

However, it is observed that when the abnormal discharge occurs within the upper electrode 46 during the pulse-on period $T_{on}$, a peak-to-peak value $V_{pp}$ of the high frequency power LF for ion attraction contributed to the growth rate or the thickness of the plasma sheath $SH_{RF}$ fluctuates greatly on the high frequency transmission line 45. In the plasma etching apparatus according to the present exemplary embodiment, the $V_{pp}$ detectors 107A and 107B are provided in the matching units 40 and 42, respectively (FIG. 3). The peak-to-peak value $V_{pp}$ of the high frequency power LF for ion attraction on the high frequency transmission line 45 is measured by the $V_{pp}$ detector 107B within the matching device 42, and the $V_{pp}$ measurement value is analyzed by a CPU processing within the main control unit 72 or the matching controller 104B. As a result, monitoring information (FIG. 15 and FIG. 16) indicating whether the abnormal discharge occurs within the upper electrode 46 can be acquired.

Figure 15:
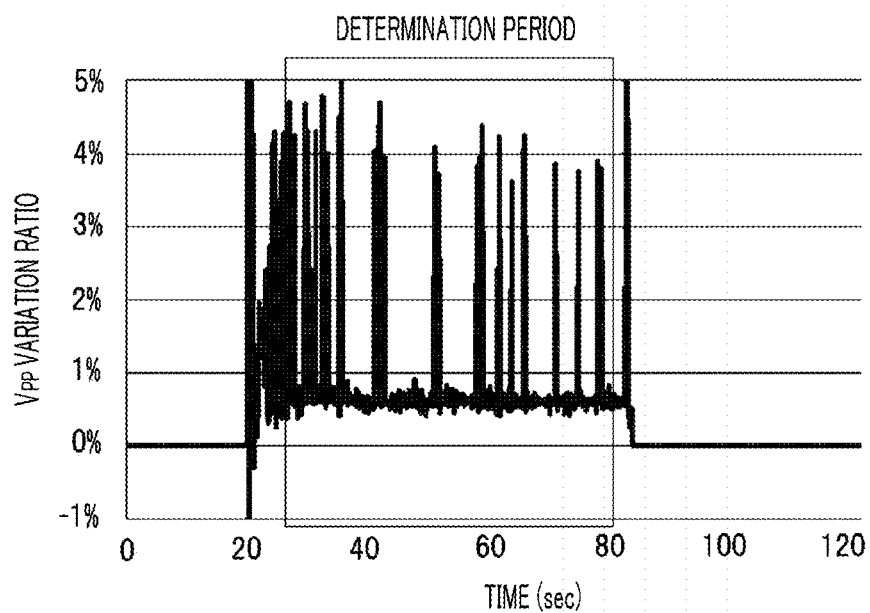
FIG. 15 is a diagram illustrating an example of monitoring information obtained when the abnormal discharge within the upper electrode occurs in the plasma processing apparatus of FIG. 1.

Herein, the monitoring information shown in FIG. 15 is an example obtained when the abnormal discharge occurs within the upper electrode 46. As can be seen from this figure, a $V_{pp}$ variation ratio rises frequently and greatly (by several % or more) during a determination period set as a monitoring period. Generally, as the frequency of the abnormal discharge occurrence increases, the $V_{pp}$ variation ratio tends to increase. On the illustrated graph, the $V_{pp}$ variation ratio on a vertical axis is represented by, for example, the following equation (2):

$$V_{pp} \text{ variation ratio} = 100 \times (V_{pp\text{-}max} - V_{pp\text{-}ave})/V_{pp\text{-}ave} \quad (2)$$

Herein, the $V_{pp\text{-}max}$ is the maximum value of $V_{pp}$ during a preset sampling period $T_s$ set within the determination period, and the $V_{pp\text{-}ave}$ is an average value of $V_{pp}$ during the sampling period $T_s$.

Figure 16:
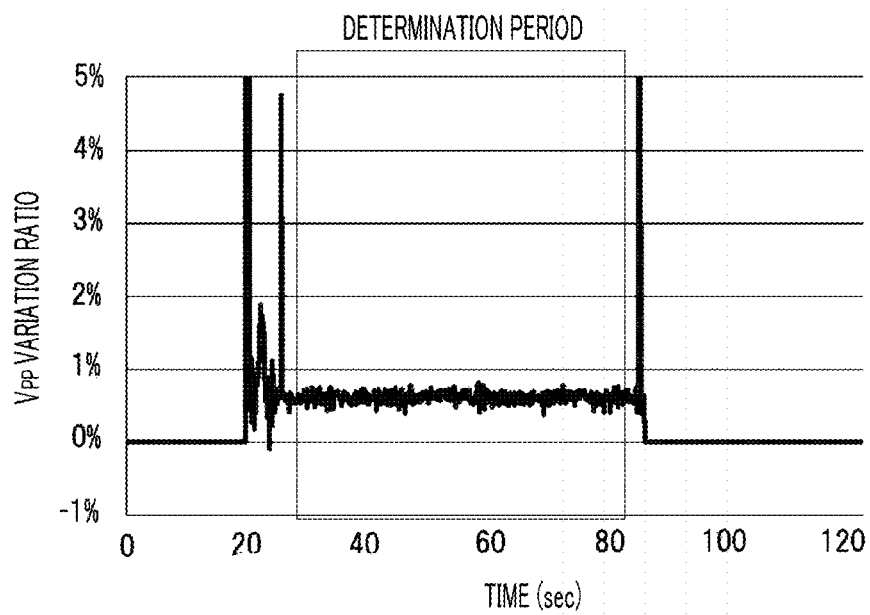
FIG. 16 is a diagram illustrating an example of monitoring information obtained when the abnormal discharge within the upper electrode does not occur in the plasma processing apparatus of FIG. 1.

The monitoring information illustrated in in FIG. 16 is an example obtained when the abnormal discharge does not occur within the upper electrode 46. The $V_{pp}$ variation ratio is stabilized to several % or less (1% or less in the shown example) throughout the determination section. Further, the plasma is ignited to be extinguished at timings immediately after the start of the monitoring period and immediately before the end of the monitoring period, respectively. At these times, since the $V_{pp}$ variation ratio increases regardless of whether or not the abnormal discharge occurs, these times are excluded from the determination period.

The present inventors have conducted an experiment of varying a gas pressure, and a frequency f, and a duty ratio $D_s$ of the pulse modulation as parameters in the HARC process as described above, and examined whether or not the abnormal discharge occurs within the upper electrode in each pulse modulation. In this experiment, a fluorocarbon-based gas is used as the etching gas; the high frequency power HF for plasma generation and the high frequency power LF for ion attraction during the pulse-on period $T_{on}$ are set to be 2000 kW and 14000 kW, respectively; and the high frequency power HF for plasma generation during the pulse-off period $T_{off}$ is set to be 100 W, the same as in the above-described example. Further, as the parameters, gas pressures are set to be five values, 10 mTorr, 15 mTorr, 20 mTorr, 25 mTorr, and 30 mTorr; the frequency $f_s$ of the pulse modulation is set to be three values, 4 kHz, 5 kHz, and 10 kHz; and the duty ratio $D_s$ is set to be five values, 20%, 30%, 40%, 50%, and 60%.

Figure 17A:
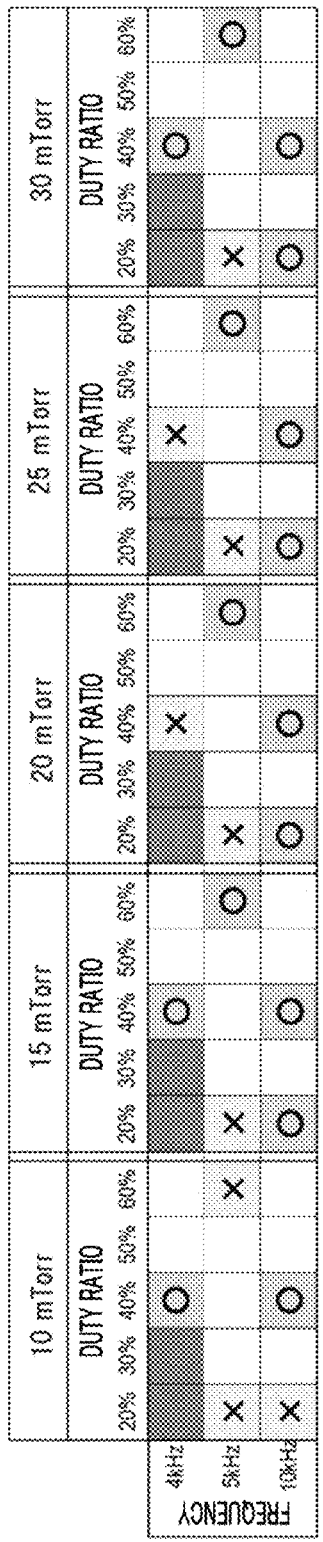
FIG. 17A and FIG. 17B are diagrams showing results of experiments conducted to investigate whether the abnormal discharge within the upper electrode occurs in the plasma processing apparatus of FIG. 1.
Figure 17B:
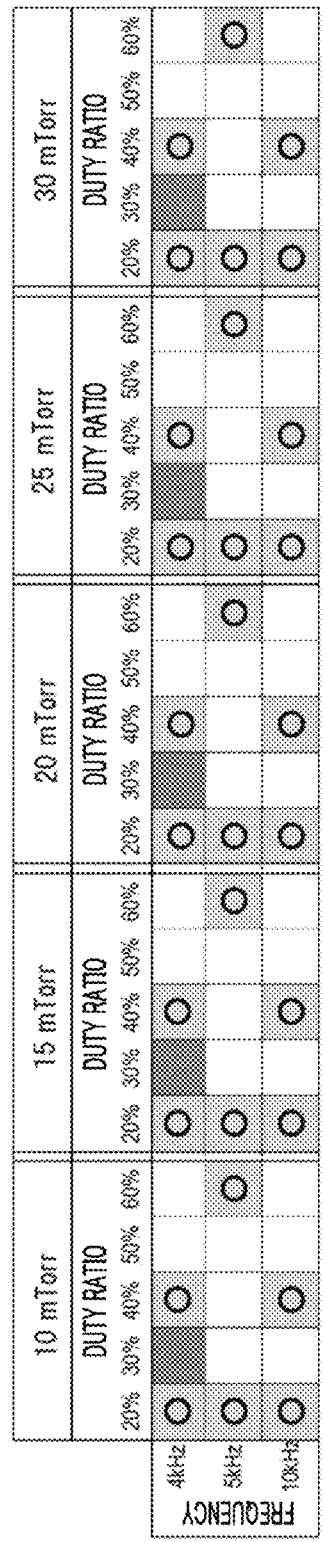

FIG. 17A and FIG. 17B are tables showing the result of the experiment. In the tables, "O" represents a case where the $V_{pp}$ variation ratio of the monitoring information is equal to or less than 2% (tolerance value) and shows a determination result indicating "absence of abnormal discharge". Further, "X" represents a case where the $V_{pp}$ variation ratio of the monitoring information exceeds 2% (tolerance value) and shows a determination result indicating "presence of abnormal discharge".

FIG. 17A depicts a case where the on/off pulse modulation is performed on both of the high frequency power HF for plasma generation and the high frequency power LF for ion attraction. In this case, the result indicating "presence of abnormal discharge" (X) is widely observed throughout the entire variation range of all the parameters (the gas pressure, and the frequency $f_s$ and the duty ratio $D_s$ of the pulse modulation).

FIG. 17B illustrates a case where the high/low pulse modulation is performed on the high frequency power HF for plasma generation and the on/off pulse modulation is performed on the high frequency power LF for ion attraction. In this case, only the result indicating "absence of abnormal discharge" (O) is observed throughout the entire variation range of all the parameters (the gas pressure, and the frequency $f_s$ and the duty ratio $D_s$ of the pulse modulation).

As stated above, by employing the modulation method in which the high/low pulse modulation is performed on the high frequency power HF for plasma generation and the on/off pulse modulation is performed on the high frequency power LF for ion attraction, it is possible to effectively suppress the occurrence of the abnormal discharge within the upper electrode 46. However, this method requires an appropriate technique for accurately and stably maintaining the power (load power) of the high frequency power HF for plasma generation at a low optimum set value during the pulse-off period $T_{off}$. In this regard, as described above, the technique of controlling a balance between the reflection wave power $PR_H$ during the pulse-on period $T_{on}$ and the reflection wave power $PR_L$ during the pulse-off period $T_{off}$ by adjusting the weighted variable K in the impedance sensor 106A of the matching device 40 and the technique of carrying out the independent feedback control on the load power $PL_L$ during the pulse-off period $T_{off}$ in the high frequency power supply 36 may be appropriately used.

<Other Exemplary Embodiments or Modification Examples>

While the present disclosure has been described with respect to the exemplary embodiments, the exemplary embodiments are not intended to be limiting, and various modifications may be made without departing from the scope and spirit of the present disclosure.

In the exemplary embodiments, when combining the first (plasma generation system) power modulation mode, the second (ion attraction system) power modulation mode, and the upper DC application mode, it is possible to select the individual modes in various combinations. Further, it is possible to perform the high/low pulse modulation on the high frequency power HF for plasma generation without performing any pulse modulation on the high frequency power LF for ion attraction, or, reversely, it may be also possible to perform the high/low pulse modulation on the high frequency power LF for ion attraction without performing any pulse modulation on the high frequency power HF for plasma generation. Further, either one of the first power modulation mode and the second power modulation mode may be used, or the upper DC application mode may not be used.

In the above-described exemplary embodiment (FIG. 1), the high frequency power HF for plasma generation is applied to the susceptor (lower electrode) 16. However, the high frequency power HF for plasma generation may be applied to the upper electrode 46.

The exemplary embodiments may not be limited to the capacitively coupled plasma etching apparatus and can be applied to a capacitively coupled plasma processing apparatus configured to perform various plasma processes such as plasma CVD, plasma ALD, plasma oxidation, plasma nitrification, sputtering, and so forth. Furthermore, the exemplary embodiments may also be applied to an inductively coupled plasma processing apparatus in which a high frequency electrode (antenna) is provided in the vicinity of a chamber. Further, the processing target object of the exemplary embodiments may not be limited to the semiconductor wafer, but various types of substrates for a flat panel display, an organic EL or a solar cell, or a photo mask, a CD substrate, and a printed circuit board may also be used.

From the foregoing, it will be appreciated that various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus of generating plasma by high frequency discharge of a processing gas within a decompression processing vessel that accommodates therein a processing target object, which is loaded into and unloaded from the processing vessel, and performing a process on the processing target object within the processing vessel with the plasma, the plasma processing apparatus comprising:
   a first high frequency power supply configured to output a first high frequency power;
   a first high frequency power modulation unit configured to pulse-modulate an output of the first high frequency power supply with a modulation pulse having a regular frequency such that the first high frequency power has a high level during a first period and has a low level lower than the high level during a second period, the first period and the second period being repeated alternately with a preset duty ratio;
   a first high frequency transmission line configured to transmit the first high frequency power outputted from the first high frequency power supply to a first electrode provided within or in the vicinity of the processing vessel; and
   a first matching device configured to measure a load impedance on the first high frequency transmission line with respect to the first high frequency power supply, and configured to match a weighted average measurement value, which is obtained by weighted-averaging a load impedance measurement value during the first period and a load impedance measurement value during the second period with a preset weighted value, with an output impedance of the first high frequency power supply.

2. The plasma processing apparatus of claim 1, further comprising:
   a second high frequency power supply configured to output a second high frequency power;
   a second high frequency transmission line configured to transmit the second high frequency power outputted from the second high frequency power supply to the first electrode or a second electrode provided within or in the vicinity of the processing vessel; and
   a second high frequency power modulation unit configured to pulse-modulate an output of the second high frequency power supply with the modulation pulse such that the second high frequency power is turned on or has a high level during the first period and the second high frequency power is turned off or has a low level lower than the high level during the second period.

3. The plasma processing apparatus of claim 2,
wherein the second high frequency power has a frequency suitable for attracting ions from the plasma into the processing target object.

4. The plasma processing apparatus of claim 1,
wherein the first high frequency power supply comprises:
a first RF power monitor configured to detect, on the first high frequency transmission line, a power of a progressive wave propagating in a forward direction from the first high frequency power supply toward the first electrode and a power of a reflection wave propagating in a backward direction from the first electrode toward the first high frequency power supply, and configured to generate a progressive wave power detection signal and a reflection wave power detection signal indicating the power of the progressive wave and the power of the reflection wave, respectively;
a first load power measurement unit configured to obtain a measurement value of a load power applied to a load including the plasma, based on the progressive wave power detection signal and the reflection wave power detection signal detected from the first RF power monitor; and
a first high frequency output control unit configured to perform a feedback control on the power of the progressive wave during the second period in each cycle of the modulation pulse such that the measurement value of the load power obtained from the first load power measurement unit is equal to or approximate to a load power set value.

5. The plasma processing apparatus of claim 1,
wherein the first high frequency power supply comprises:
a first RF power monitor configured to detect, on the first high frequency transmission line, a power of a progressive wave propagating in a forward direction from the first high frequency power supply toward the first electrode and a power of a reflection wave propagating in a backward direction from the first electrode toward the first high frequency power supply, and configured to generate a progressive wave power detection signal and a reflection wave power detection signal indicating the power of the progressive wave and the power of the reflection wave, respectively;
a first load power measurement unit configured to obtain a measurement value of a load power applied to a load including the plasma, based on the progressive wave power detection signal and the reflection wave power detection signal detected from the first RF power monitor; and
a first high frequency output control unit configured to perform a feedback control on the power of the progressive wave during the first period and the second period individually in each cycle of the modulation pulse such that the measurement value of the load power obtained from the first load power measurement unit is equal to or approximate to a first load power set value and a second load power set value applied during the first period and the second period, respectively.

6. The plasma processing apparatus of claim 1,
wherein the first high frequency power has a frequency suitable for generating the plasma.

7. The plasma processing apparatus of claim 6,
wherein the processing target object is placed on the first electrode.

8. The plasma processing apparatus of claim 2,
wherein the second high frequency power during the second period is higher than a minimum power required to maintain a plasma generation state.

9. The plasma processing apparatus of claim 2, further comprising:
a DC power supply unit configured to apply a negative DC voltage to the second electrode only during the second period in synchronization with the modulation pulse.

10. The plasma processing apparatus of claim 1, further comprising:
a DC power supply unit configured to apply a negative DC voltage to an electrode facing the processing target object via a plasma generation space within the processing vessel, and set an absolute value of the negative DC voltage during the second period to be higher than an absolute value thereof during the first period in synchronization with the modulation pulse.

11. The plasma processing apparatus of claim 1,
wherein a frequency of the modulation pulse is in a range from 2 kHz to 8 kHz, and a duty ratio of the modulation pulse is in a range from 20% to 80%.

\* \* \* \* \*

UNITED STATES PATENT AND TRADEMARK OFFICE
CERTIFICATE OF CORRECTION

PATENT NO. : 10,115,567 B2
APPLICATION NO. : 14/853140
DATED : October 30, 2018
INVENTOR(S) : Taichi Hirano et al.

Page 1 of 1

It is certified that error appears in the above-identified patent and that said Letters Patent is hereby corrected as shown below:

In the Specification

Column 16, Line 24, "Z" should be -- $Z_S$ --.

Column 17, Line 1, "Z" should be -- $Z_S$ --.

Column 29, Line 39, "f," should be -- $f_S$ --.

Signed and Sealed this
Twenty-second Day of January, 2019

Andrei Iancu
*Director of the United States Patent and Trademark Office*